(12) United States Patent
Itoh et al.

(10) Patent No.: US 10,658,812 B2
(45) Date of Patent: May 19, 2020

(54) EYE-SAFE LIGHT SOURCE

(71) Applicant: SHARP KABUSHIKI KAISHA, Sakai, Osaka (JP)

(72) Inventors: Shin Itoh, Sakai (JP); Keisuke Miyazaki, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 4 days.

(21) Appl. No.: 15/776,047

(22) PCT Filed: Oct. 7, 2016

(86) PCT No.: PCT/JP2016/080018
§ 371 (c)(1),
(2) Date: May 14, 2018

(87) PCT Pub. No.: WO2017/086053
PCT Pub. Date: May 26, 2017

(65) Prior Publication Data
US 2018/0331492 A1 Nov. 15, 2018

(30) Foreign Application Priority Data
Nov. 20, 2015 (JP) ................. 2015-228111

(51) Int. Cl.
*H01S 5/022* (2006.01)
*F21K 9/00* (2016.01)

(52) U.S. Cl.
CPC ........... *H01S 5/02228* (2013.01); *F21K 9/00* (2013.01); *H01S 5/02292* (2013.01);
(Continued)

(58) Field of Classification Search
CPC ............ H01S 5/02276; H01S 5/02292; H01S 5/02228; H01S 5/02296; H01S 5/0222; H01S 5/02244; H01S 5/02288; F21K 9/00
See application file for complete search history.

(56) References Cited

U.S. PATENT DOCUMENTS 7,502,399 B2 * 3/2009 Ferstl ................. H01S 5/02216
372/103
2007/0091945 A1 4/2007 Ferstl
(Continued)

FOREIGN PATENT DOCUMENTS

CN 103403892 A 11/2013
JP S54-093371 U1 7/1979
(Continued)

*Primary Examiner* — Armando Rodriguez
(74) *Attorney, Agent, or Firm* — ScienBiziP, P.C.

(57) ABSTRACT

Light emission efficiency is increased in an eye-safe light source by regulating light distribution properties. An eye-safe light source includes a package, a semiconductor laser that emits laser light from a left light emission end surface and a right light emission end surface, and a wire that is joined to the semiconductor laser. The semiconductor laser is joined to the package such that the laser light is emitted parallel to an upper surface of a lead frame of the package. The package includes reflection surfaces that face the left light emission end surface and the right light emission end surface and reflect the laser light. In top view, a direction in which the wire extends is perpendicular to a direction of emission of the laser light.

20 Claims, 10 Drawing Sheets

(52) U.S. Cl.
CPC .. *H01S 5/02296* (2013.01); *H01L 2224/4809* (2013.01); *H01L 2224/48091* (2013.01); *H01L 2224/49107* (2013.01); *H01S 5/0222* (2013.01); *H01S 5/02244* (2013.01); *H01S 5/02276* (2013.01); *H01S 5/02288* (2013.01)

(56) References Cited

U.S. PATENT DOCUMENTS

| | | | |
|---|---|---|---|
| 2010/0246159 A1* | 9/2010 | Wada | F21K 9/00 362/84 |
| 2013/0341666 A1* | 12/2013 | Yoshida | H01L 33/501 257/98 |
| 2015/0003482 A1 | 1/2015 | Monadgemi et al. | |

FOREIGN PATENT DOCUMENTS

| | | | |
|---|---|---|---|
| JP | 2002-100827 A | 4/2002 |
| JP | 2005-142447 A | 6/2005 |
| JP | 2006-352105 A | 12/2006 |
| JP | 2007-027716 A | 2/2007 |
| JP | 2007-266484 A | 10/2007 |
| JP | 4014425 B2 | 11/2007 |
| JP | 2010-251686 A | 11/2010 |
| JP | 2011-096724 A | 5/2011 |
| JP | 5046538 B2 | 10/2012 |
| JP | 2013-143428 A | 7/2013 |
| JP | 2014-183269 A | 9/2014 |

\* cited by examiner

EYE-SAFE LIGHT SOURCE

TECHNICAL FIELD

The present invention relates to an eye-safe light source that is made eye-safe, and an electronic device that includes the eye-safe light source.

BACKGROUND ART

In recent years, optical wireless communication modules represented by infrared data association (IrDA) and the like, optical sensor modules, and the like have been widely mounted in electronic devices such as a mobile phone and a notebook personal computer. For example, PTL 1 discloses an optical proximity sensor (reflection type optical coupling device) that is mounted in a mobile phone.

Such a portable electronic device has a battery as an electric power source. Thus, it is highly desirable to reduce the electric power consumption of mounted modules. In an optical wireless communication facility that uses illumination, it is also desirable to reduce electric power consumption from the viewpoint of energy efficiency. In the optical wireless communication modules, the optical sensor modules, and the like, a light source that emits light mainly consumes electric power. Thus, it is desirable to reduce the electric power consumption of the light source.

Safety of eyes of a person (eye safety) should be secured for a light source that is used for optical wireless communication, optical sensing, and the like. In addition, since such a light source is used for optical wireless communication, optical sensing, and the like, the light distribution properties of the light source need to be regulated.

For example, PTL 2 to PTL 4 disclose an eye-safe light source in which laser light emitted by a semiconductor laser is made eye-safe. In the eye-safe light source disclosed in PTL 2 to PTL 4, transmitting the laser light through a light scattering layer increases the spot diameter of the laser light, and the laser light is made eye-safe. PTL 5 discloses the shape of a lens that regulates light distribution characteristics such that light from an eye-safe light source in which laser light is made eye-safe is regulated to have a light intensity distribution suitable for optical wireless communication.

CITATION LIST

Patent Literature

PTL 1: Japanese Unexamined Patent Application Publication No. 2011-96724 (published on May 12, 2011)

PTL 2: Japanese Patent No. 4014425 (issued on Nov. 28, 2007)

PTL 3: Japanese Patent No. 5046538 (issued on Oct. 10, 2012)

PTL 4: Japanese Unexamined Patent Application Publication No. 2007-266484 (published on Oct. 11, 2007)

PTL 5: Japanese Unexamined Patent Application Publication No. 2005-142447 (published on Jun. 2, 2005)

SUMMARY OF INVENTION

Technical Problem

In the related art in PTL 2 to PTL 4, multiple light scattering occurs while the laser light is transmitted through the light scattering layer. Since the multiple light scattering causes light absorption, there is a problem of decrease in light extraction efficiency (light emission efficiency) with respect to electric power consumption. In addition, the light distribution characteristics and the polarization characteristics of the laser light are lost by the multiple scattering.

Furthermore, a wire that is connected to the semiconductor laser passes through the light scattering layer that causes multiple scattering of the laser light. Thus, the wire casts a shadow on a virtual light source in which the laser light is made eye-safe, and there is a problem of decrease in light emission efficiency. The shadow of the wire causes non-uniformity in the light density of the virtual light source, and the virtual light source deviates from an ideal light intensity distribution.

When the semiconductor laser is joined to a substrate without a submount, the laser light that is emitted to spread from the semiconductor laser hits the substrate. Thus, the laser light cannot spread, and the performance of making the laser light eye-safe deteriorates. Even when the submount is used, the submount casts a shadow on the virtual light source when the semiconductor laser is joined on the inner side of the submount, and the light emission efficiency is decreased.

As described above, the eye-safe light source in the related art has a problem of losing the light distribution characteristics and a problem of decrease in light emission efficiency caused by making the laser light eye-safe.

The invention is conceived in view of the above problems. An object of the invention is to improve light emission efficiency while regulating light distribution characteristics in an eye-safe light source.

Solution to Problem

In order to resolve the problems, an eye-safe light source according to one aspect of the invention is characterized by including a substrate, a semiconductor laser that emits laser light from a light emission end surface, and a wire that is joined to the semiconductor laser. The semiconductor laser is joined to the substrate such that the laser light is emitted in a direction parallel to a reference surface of the substrate. The substrate includes a reflection surface that faces the light emission end surface and reflects the laser light. A direction in which the wire extends when seen from a direction perpendicular to the reference surface is perpendicular to a direction of emission of the laser light from the light emission end surface.

Advantageous Effects of Invention

According to the aspect of the invention, it is possible to improve light emission efficiency while regulating light distribution characteristics in an eye-safe light source.

BRIEF DESCRIPTION OF DRAWINGS

FIG. 1 is a diagram illustrating a schematic configuration around a semiconductor laser of an eye-safe light source according to a first embodiment of the invention. Part (a) of FIG. 1 is a top view with a resin part seen through. Part (b) of FIG. 1 is an A1-A1 sectional view of Part (a) of FIG. 1. Part (c) of FIG. 1 is a B1-B1 sectional view of Part (a) of FIG. 1. Part (d) of FIG. 1 is a bottom view with the resin part not seen through.

FIG. 2 corresponds to the right side part of Part (b) of FIG. 1 and illustrates spreading of the laser light and the optical axis of the laser light.

FIG. 5 corresponds to the right side part of Part (b) of FIG. 4 and illustrates spreading of the laser light and the optical axis of the laser light.

DESCRIPTION OF EMBODIMENTS

First Embodiment

Hereinafter, a first embodiment of the invention will be described in detail based on FIG. 1.

Figure 1:
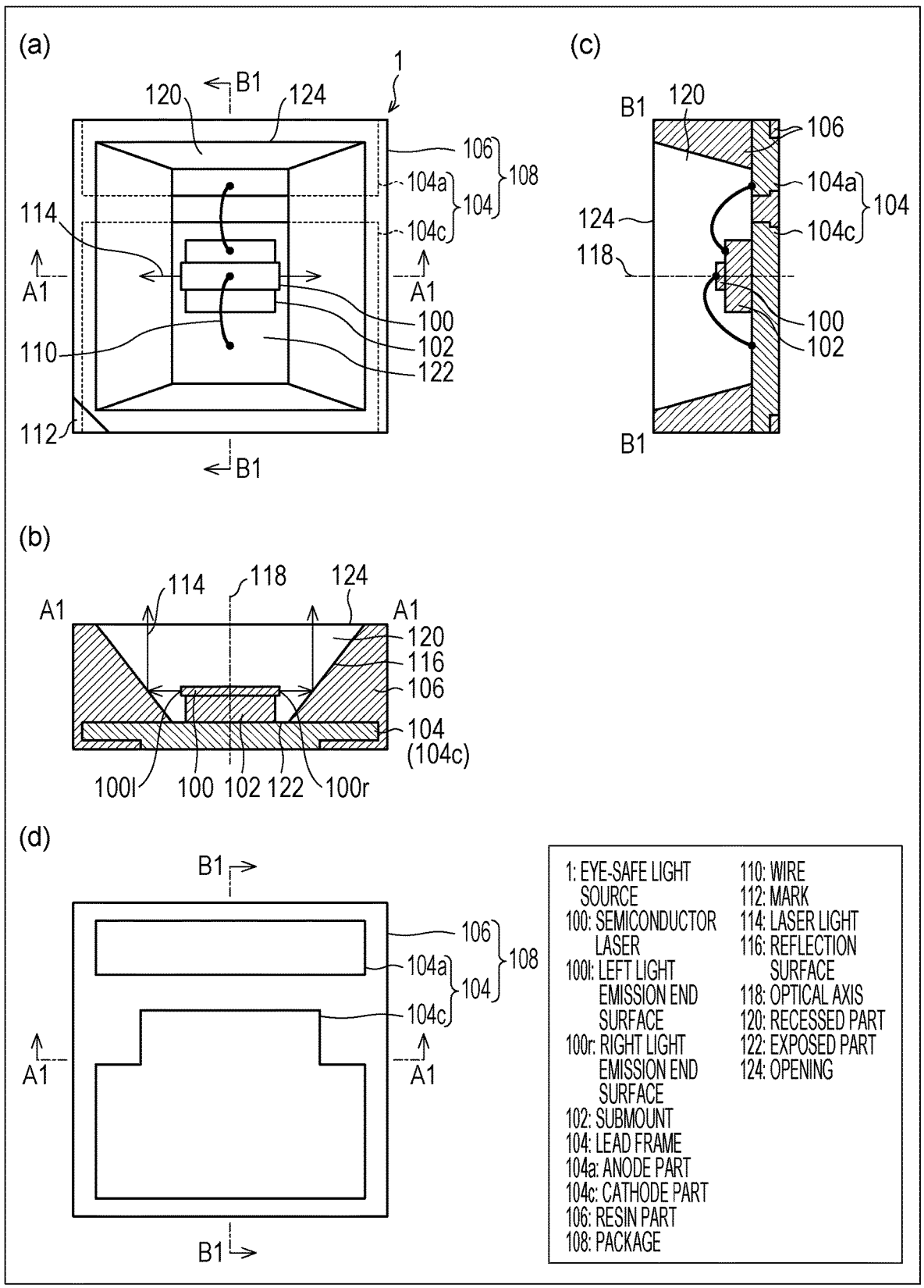

FIG. 1 is a diagram illustrating a schematic configuration around a semiconductor laser 100 of an eye-safe light source 1 according to the first embodiment of the invention. Part (a) of FIG. 1 is a top view with a resin part 106 seen through. Part (b) of FIG. 1 is an A1-A1 sectional view of Part (a) of FIG. 1. Part (c) of FIG. 1 is a B1-B1 sectional view of Part (a) of FIG. 1. Part (d) of FIG. 1 is a bottom view with the resin part 106 not seen through. While the direction of light emission of the eye-safe light source 1 is upward in the following description, the direction of the eye-safe light source 1 at the time of manufacturing or use is not limited thereto.

As illustrated in FIG. 1, the eye-safe light source 1 is a surface-mount type and includes the semiconductor laser 100, a submount 102, a package (substrate) 108, and a wire 110. The semiconductor laser 100 emits laser light 114 from a left light emission end surface 100l and a right light emission end surface 100r on both of its left and right sides. The semiconductor laser 100 is mounted on the submount 102. The package 108 has a metal lead frame (hereinafter, simply referred to as a lead frame) 104 and the resin part 106. A mark 112 is disposed to indicate the directions of an anode and a cathode.

An optical axis 118 indicates the direction of emission of eye-safe light from the eye-safe light source 1. The optical axis 118 is perpendicular to the upper surface (reference surface) of the lead frame 104 and the upper surface of the package 108.

(Package)

The package 108 is a member in which the surrounding area of the lead frame 104 is partially covered (packaged) with the resin part 106. A recessed part 120 (internal space) that has an opening (opening part) 124 is formed in the resin part 106. A part (exposed part 122) of the upper surface of the lead frame 104 is exposed from the recessed part 120. The opening 124 is open on the upper surface of the package 108. The package 108 accommodates the semiconductor laser 100 inside the recessed part 120.

The lead frame 104 is acquired by stamping a thin plate of metal such as a copper-based alloy, and plating the stamped plate. The lead frame 104 has excellent thermal conductivity, thermal radiation properties, mechanical strength, and electrical conductivity. The exposed part 122 on the upper surface of the lead frame 104 is exposed to the recessed part 120 without being covered with the resin part 106 as illustrated in Part (a) to Part (c) of FIG. 1 in order to be electrically and thermally connected to the semiconductor laser 100. Most of the lower surface of the lead frame 104 is exposed downward from the resin part 106 as illustrated in Part (b) to Part (d) of FIG. 1 in order to radiate heat. The lead frame 104 is electrically connected to the outside through a lead terminal that is not illustrated in FIG. 1. Alternatively, the lead frame 104 may be electrically connected to the outside through the lower surface of the lead frame 104 that is exposed from the resin part 106.

The lead frame 104 includes a cathode part 104c and an anode part 104a. The cathode part 104c is connected to the cathode of the semiconductor laser 100. The anode part 104a is connected to the anode of the semiconductor laser 100. The cathode part 104c and the anode part 104a are joined to each other by the resin part 106, and are insulated from each other by the resin part 106. The submount 102 on which the semiconductor laser 100 is mounted is joined onto the exposed part 122 of the cathode part 104c. The cathode part 104c and the anode part 104a may be opposite to each other in size and arrangement with respect to the semiconductor laser 100.

A resin that forms the resin part 106 is a white thermoplastic resin that is generally used in a light emitting diode (LED) light source and includes a light scattering body which scatters the laser light 114. The resin part 106 may be formed with, for example, a polycyclohexylenedimethylene terephthalate (PCT) resin or a polyphthalamide (PPA) resin. While a white resin is used for improving reflectance, a resin having other colors such as red may be used depending on the wavelength of the laser light 114 and the application of the eye-safe light source 1. In addition, while a thermoplastic resin is used, a resin having other properties such as a thermosetting resin and a light cure resin may be used depending on a method of manufacturing the package 108.

While illustration is not provided in FIG. 1, a control element for controlling the light emission of the semiconductor laser 100 may be joined to the lead frame 104 and resin-sealed by the resin part 106. Other semiconductor elements may also be resin-sealed inside the package 108.

The mark 112 is formed as a recess having a shape of an isosceles right triangle in the resin part 106 on the upper surface of the package 108. Accordingly, since the mark 112 can be formed at the same time as the formation of the resin part 106, errors in the position of the mark 112 can be prevented. The mark 112 may not be disposed.

The metal lead frame 104 has excellent thermal conductivity and thermal radiation properties. Thus, by joining the submount 102 on which the semiconductor laser 100 is mounted to the exposed part 122 of the lead frame 104, heat generated by the semiconductor laser 100 can be promptly radiated. Accordingly, the eye-safe light source 1 has excellent thermal radiation properties.

The metal lead frame 104 reinforces the resin part 106. Thus, the package 108 including the metal lead frame 104 has more excellent mechanical strength than a package that does not include a metal lead frame. Therefore, even when the package 108 is thinned, mechanical strength required for the eye-safe light source 1 can be accomplished, and the eye-safe light source 1 can be thinned.

(Recessed Part)

The recessed part 120 has a shape of an approximately reversed quadrangular truncated pyramid. The recessed part 120 is formed to have upper edges (opening 124) having an oblong shape open on the upper surface of the package 108, lower edges having an oblong shape where the exposed part 122 of the lead frame 104 is exposed, and four trapezoidal side surfaces extending between the upper edges and the lower edges. The area of the upper edges is larger than the area of the lower edges. The recessed part 120 may have other shapes such as an approximately reversed circular truncated cone.

In a case where the recessed part 120 has a simple shape such as an approximately reversed quadrangular truncated pyramid and an approximately reversed circular truncated cone, the recessed part 120 can be easily formed. Thus, the cost of manufacturing the package 108 including the recessed part 120, that is, the eye-safe light source 1 including the package 108, can be reduced.

The inside of the recessed part 120 is hollow, and the opening 124 of the recessed part 120 is open and not closed. Accordingly, nothing is present particularly in the vicinity of both light emission end surfaces (the left light emission end surface 100l and the right light emission end surface 100r) of the semiconductor laser 100, and either a vacuum or gas such as air is present in the vicinity of both light emission end surfaces.

Thus, a substance such as the light scattering body that generates heat by absorbing the laser light 114 is not present in the vicinity of both light emission end surfaces (the left light emission end surface 100l and the right light emission end surface 100r) of the semiconductor laser 100. Since heat is not generated, substances in the vicinity of both light emission end surfaces of the semiconductor laser 100 are not thermally damaged.

Accordingly, there is no deterioration of the function of the eye-safe light source 1 caused by modification of the substances in the vicinity of both light emission end surfaces (the left light emission end surface 100l and the right light emission end surface 100r). That is, deterioration of the eye safety properties and light emission efficiency of the eye-safe light source 1 caused by continuous use and long-term use can be prevented. Accordingly, the useful life of the eye-safe light source 1 is extended. In addition, since neither a substance that is thermally damaged, nor a substance that is optically damaged is present inside the recessed part 120 in the eye-safe light source 1, the substances in the vicinity of both light emission end surfaces of the semiconductor laser 100 are neither damaged thermally nor optically.

The part of the semiconductor laser 100 other than both light emission end surfaces (the left light emission end surface 100l and the right light emission end surface 100r) may be covered with resin and the like. In addition, both light emission end surfaces of the semiconductor laser 100 may be covered if the substances of both light emission end surfaces do not generate heat by absorbing the laser light 114 like a transparent resin that does not include a light scattering body.

Meanwhile, in the related art where a semiconductor laser is sealed with a sealing resin that includes a light scattering body, the light scattering body included in the sealing resin generates heat by absorbing laser light. Thus, a problem arises in that the light scattering body and the sealing resin are modified in the vicinity of light emission end surfaces where light density is particularly high. The same applies in the related art where a semiconductor laser is sealed with liquid including a light scattering body without using resin.

The inside of the recessed part 120 is hollow, and the semiconductor laser 100 inside the recessed part 120 is exposed without being resin-sealed or gas-sealed. Furthermore, the semiconductor laser 100 is joined to the lead frame 104 with the submount 102 in between. Thus, the semiconductor laser 100 can expand and contract depending on changes in temperature. The ability of the semiconductor laser 100 to expand and contract is preferable from the viewpoint of mechanical load.

The semiconductor laser 100 generates heat when the semiconductor laser 100 emits light. Thus, in a case where the semiconductor laser 100 is resin-sealed, stress is generated by a difference in the coefficient of thermal expansion between the semiconductor laser 100 and the sealing resin, and a mechanical load is applied to the semiconductor laser 100, the sealing resin, and the like. While the result of such a mechanical load is not described herein, any defect may occur. Accordingly, it is preferable that the semiconductor laser 100 is not resin-sealed so that stress is not generated. In a case where the semiconductor laser 100 is gas-sealed, the sealing gas expands by the heat generated by the semiconductor laser 100 and generates stress on the package 108, and a load is exerted particularly on the resin part 106. Thus, it is preferable that the semiconductor laser 100 is not gas-sealed.

(Submount and Semiconductor Laser)

As illustrated in Part (a) of FIG. 1, the submount 102 is joined to the exposed part 122 of the cathode part 104c of the lead frame 104 at the center of the lower edges of the recessed part 120 of the package 108. The submount 102 is electrically connected to the anode of the semiconductor laser 100, and is electrically connected to the anode part 104a of the lead frame 104 through the wire 110. In addition, the submount 102 is thermally connected to the semiconductor laser 100, and is thermally connected to the cathode part 104c of the lead frame 104.

The semiconductor laser 100 is an infrared semiconductor laser that emits laser light in a wavelength longer than 700 nm. In addition, as illustrated in Part (b) of FIG. 1, the semiconductor laser 100 symmetrically emits the laser light 114 from the left light emission end surface 100*l* and the right light emission end surface 100*r*. Accordingly, both of the left and right end surfaces of a resonator formed in the semiconductor laser 100, and the vicinity of the end surfaces are optically symmetric. For example, an equivalent optical end surface coat or an equivalent optical window structure may be formed on the left light emission end surface 100*l* and the right light emission end surface 100*r* of the semiconductor laser 100. Alternatively, the left light emission end surface 100*l* and the right light emission end surface 100*r* of the semiconductor laser 100 may be exposed without either the optical end surface coat or the optical window structure.

As illustrated in Part (a) and Part (b) of FIG. 1, the semiconductor laser 100 is mounted on the submount 102 such that the left light emission end surface 100*l* and the right light emission end surface 100*r* extend over the submount 102. Since the left light emission end surface 100*l* and the right light emission end surface 100*r* extend, the laser light 114 is emitted toward the resin part 106 without being blocked by the submount 102.

The semiconductor laser 100 is joined to the lead frame 104 with the submount 102 in between such that the laser light 114 is emitted parallel to the upper surface of the lead frame 104. That is, the semiconductor laser 100 is flatly mounted on the lead frame 104 such that the resonator of the semiconductor laser 100 is parallel to the upper surface of the lead frame 104, and that an active layer of the semiconductor laser 100 is parallel to the upper surface of the lead frame 104.

Infrared light has the lowest energy per photon among infrared light, visible light, and ultraviolet light. Thus, in a case where the resin part 106 is formed with a resin (a PCT resin, a PPA resin, or the like) that is generally used for packaging a blue LED and a white LED with a resin, the resin part 106 has sufficient durability with respect to the laser light 114 emitted from the semiconductor laser 106 and long-term reliability since the semiconductor laser 100 is an infrared laser. However, the semiconductor laser 100 is not limited to an infrared laser, and a visible semiconductor laser that emits laser light in a wavelength in the visible spectrum, or an ultraviolet semiconductor laser that emits laser light in a wavelength in the ultraviolet spectrum may also be used as the semiconductor laser 100. For the laser light in the visible spectrum, it is preferable that an epoxy molding compound (EMC) that is a white thermosetting epoxy resin having excellent light fastness is used as the resin of the resin part 106.

Since the left light emission end surface 100*l* and the right light emission end surface 100*r* extend over the submount 102, the laser light 114 emitted from the semiconductor laser 100 is emitted toward the resin part 106 without being blocked by the submount 102. Therefore, since the submount 102 does not cast a shadow, the light extraction efficiency of the eye-safe light source 1 with respect to the laser light 114 can be improved. Furthermore, by improving the light extraction efficiency, the electric power consumption of the eye-safe light source 1 and an electronic device including the eye-safe light source 1 can be suppressed.

In addition, since the semiconductor laser 100 is joined to the upper surface of the lead frame 104 with the submount 102 in between, the laser light 114 emitted from the semiconductor laser 100 can proceed straight with spread both downward (lead frame 104 side) and upward (opening 124 side) without being blocked by the submount 102. Since the laser light 114 proceeds straight both upward and downward, the light distribution of the laser light 114 is easily predictably controlled using reflection surfaces 116 that are formed with the resin part 106.

The semiconductor laser 100 is flatly mounted on the lead frame 104. Thus, the depth of the recessed part 120 (the distance between the upper edge and the lower edge of the recessed part 120) can be decreased, and the package 108, that is, the eye-safe light source 1, can be thinned. In addition, the optical path length of the laser light 114 before reaching the reflection surfaces 116 can be increased without changing the depth of the recessed part 120. Since the optical path length can be secured in the surface direction of the package 108 (a direction perpendicular to the optical axis 118; a direction parallel to the upper surface of the lead frame 104) and not in the thickness direction of the package 108 (a direction parallel to the optical axis 118; a direction perpendicular to the upper surface of the lead frame 104), the eye-safe light source 1 can be thinned.

(Wire)

The wire 110 is a gold wire and is an electric power line through which electric power for driving the semiconductor laser 100 is supplied.

One wire 110 connects the cathode of the semiconductor laser 100 to the cathode part 104*c* of the lead frame 104. This wire 110 extends forward (downward in Part (a) of FIG. 1) from the semiconductor laser 100 and, when seen from the direction of the optical axis 118, is approximately orthogonal to the optical axis of the laser light 114 emitted parallel to the upper surface of the lead frame 104.

Another wire 110 connects the anode part 104*a* of the lead frame 104 to the submount 102 which is connected to the anode of the semiconductor laser 100. The other wire 110 extends backward (upward in Part (a) of FIG. 1) from the submount 102 and, when seen from the direction of the optical axis 118, is approximately orthogonal to the optical axis of the laser light 114 emitted parallel to the upper surface of the lead frame 104.

That is, each wire 110 is approximately orthogonal to the laser light 114 in top view. Thus, each wire 110 does not block the laser light 114. Therefore, since each wire 110 does not cast a shadow, the light extraction efficiency of the eye-safe light source 1 with respect to the laser light 114 can be improved. Furthermore, by improving the light extraction efficiency, the electric power consumption of the eye-safe light source 1 and an electronic device including the eye-safe light source 1 can be suppressed.

Meanwhile, in the related art where a wire is approximately parallel to laser light in top view, a problem arises in that the wire casts a shadow.

(Reflection Surface)

Hereinafter, the reflection surfaces 116 on which the laser light 114 is reflected will be described.

The reflection surfaces 116 are two side surfaces that face each other among the four side surfaces of the recessed part 120. The reflection surfaces 116 face the left light emission end surface 100*l* and the right light emission end surface 100*r* of the semiconductor laser 100 from which the laser light 114 is emitted. The reflection surfaces 116 have plane symmetry about a plane (first plane of symmetry) that passes through the center of the semiconductor laser 100 (a middle point between the left light emission end surface 100*l* and the right light emission end surface 100*r*) and is perpendicular to the direction of emission of the laser light 114 by the semiconductor laser 100. In addition, the reflection surfaces 116 have plane symmetry about a plane (second plane of symmetry) that passes through the light emission center of the left light emission end surface 100*l* and the light emission center of the right light emission end surface and is perpendicular to the upper surface of the lead frame 104 and parallel to the direction of emission of the laser light 114 by the semiconductor laser 100.

Each reflection surface 116 is a flat surface that is inclined upward with respect to the upper surface of the lead frame 104. This inclination causes the laser light 114 emitted parallel to the upper surface of the lead frame 104 to be reflected in the direction of the optical axis 118. In addition, since each reflection surface 116 forms the surface of the resin part 106 that includes the light scattering body, each reflection surface 116 diffusely reflects the laser light 114. Since this diffuse reflection increases the spot diameter of the laser light 114, the density of the laser light 114 after reflection is lower than that before reflection.

In addition, since the light scattering body is not present in a region (recessed part 120) from both light emission end surfaces (the left light emission end surface 1001 and the right light emission end surface 100r) of the semiconductor laser 100 to the reflection surfaces 116, the laser light 114 is diffusely reflected while maintaining its light distribution characteristics at the time of emission to a certain extent.

(Laser Light and Making Laser Light Eye-Safe)

Hereinafter, the laser light 114 and making the laser light 114 eye-safe will be described.

When the laser light 114 is emitted approximately parallel to the upper surface of the lead frame 104 from the right light emission end surface 100r of the semiconductor laser 100, the laser light 114 is emitted to spread at a certain angle from the spot diameter in micrometers. Thus, since the laser light 114 spreads as the laser light 114 departs from the right light emission end surface 100r, the light density of the laser light 114 is decreased even though the laser light 114 is high coherence light. For example, the spread angle of the laser light 114 emitted from the semiconductor laser 100 which is an infrared semiconductor laser is approximately 20 degrees in a direction perpendicular to the active layer, and approximately 100 in a direction parallel to the active layer. The laser light 114 emitted from the left light emission end surface 1001 is also emitted to spread approximately parallel to the upper surface of the lead frame 104.

Since the laser light 114 proceeds with spread, the spot diameter of the laser light 114 is increased, and the light density of the laser light 114 is decreased to a certain extent on each reflection surface 116 separated from both light emission end surfaces (the left light emission end surface 1001 and the right light emission end surface 100r). Accordingly, the laser light 114 is already made eye-safe to a certain extent before being diffusely reflected by each reflection surface 116.

The semiconductor laser 100 symmetrically emits the laser light 114 from both light emission end surfaces of the left light emission end surface 1001 and the right light emission end surface 100r. Thus, the laser light 114 emitted from the semiconductor laser 100 has approximately half the light density of that of a semiconductor laser that emits the whole intensity of light from only one end surface. Since the laser light 114 has low light density, the laser light 114 can be easily made eye-safe.

In addition, since the reflection surfaces 116 that face the left light emission end surface 1001 and the right light emission end surface 100r are symmetric, the laser light 114 that is made eye-safe is also symmetric. Thus, the eye-safe light source 1 is a light source having favorable symmetry.

The laser light 114 that is already made eye-safe to a certain extent is sufficiently made eye-safe by being diffusely reflected by each reflection surface 116. Since the laser light 114 that is sufficiently made eye-safe is radiated through the opening 124 that is open on the upper surface of the package 108, light that is radiated from the eye-safe light source 1 is sufficiently made eye-safe.

(Light Emission Efficiency)

Hereinafter, the light emission efficiency of the eye-safe light source 1 that is the intensity of light radiated from the eye-safe light source 1 with respect to the electric power consumed by the eye-safe light source 1 will be described.

The inside of the recessed part 120 is hollow, and the light scattering body that scatters the laser light 114 is not present inside the recessed part 120. Thus, the laser light 114 reaches each reflection surface 116 without being scattered. Accordingly, the submount 102 does not absorb diffused light. Thus, the eye-safe light source 1 has excellent light emission efficiency.

The inside of the recessed part 120 is hollow, and the semiconductor laser 100 is surrounded by air. Since the semiconductor laser 100 is an infrared semiconductor laser, the left light emission end surface 1001 and the right light emission end surface 100r are generally optimally designed such that light extraction efficiency with respect to the atmosphere (air) is maximized. Accordingly, since light can be extracted with maximum efficiency from the semiconductor laser 100, the eye-safe light source 1 has excellent light emission efficiency.

The light scattering body is not present inside the recessed part 120, and the laser light 114 is not transmitted through the light scattering layer including the light scattering body inside the recessed part 120. Thus, since light absorption caused by the light scattering body does not occur, the eye-safe light source 1 has excellent light emission efficiency.

Each wire 110 is approximately perpendicular to the direction of emission of the laser light 114 in top view (when seen from a direction perpendicular to the upper surface of the lead frame 104). Thus, each wire 110 does not block the optical path of the laser light 114, and each wire 110 does not cast a shadow on a virtual light source in which the laser light 114 is made eye-safe. Thus, the eye-safe light source 1 has excellent light emission efficiency. Furthermore, since each wire 110 extends inside the recessed part 120 where the light scattering body is not present, each wire 110 does not absorb scattered light. Thus, the eye-safe light source 1 has excellent light emission efficiency.

The semiconductor laser 100 is mounted on the submount 102 such that the left light emission end surface 1001 and the right light emission end surface 100r extend over the submount 102 in top view. Thus, the laser light 114 that is emitted to spread from the left light emission end surface 1001 and the right light emission end surface 100r reaches each reflection surface 116 without being blocked by the submount 102. Furthermore, by interposing the submount between the semiconductor laser 100 and the lead frame 104, the semiconductor laser 100 is elevated from the upper surface of the lead frame 104. Thus, the laser light 114 can directly reach each reflection surface 116 without being reflected on the upper surface of the lead frame 104 or blocked by the lead frame 104. Accordingly, the submount 102 does not cast a shadow on the virtual light source in which the laser light 114 is made eye-safe, and stray light due to reflection on the lead frame 104 is not generated. Thus, the eye-safe light source 1 has excellent light emission efficiency.

The resin part 106 that has each reflection surface 116 is a white resin including a light scattering body that is generally used in an LED light source. Thus, each reflection surface 116 has high light reflectance and low light absorbance. Accordingly, the eye-safe light source 1 has excellent light emission efficiency.

(Light Distribution Characteristics and Polarization Characteristics)

Hereinafter, polarization characteristics and light distribution characteristics in the eye-safe light source 1 will be described.

While the laser light 114 is diffusely reflected on each reflection surface 116, the laser light 114 is not scattered before reaching each reflection surface 116. Thus, the intensity distribution of the light density of the laser light 114 that is diffusely reflected by each reflection surface 116 appropriately averages out by scattering and almost maintains the light distribution characteristics at the time of emission from the left and right light emission end surfaces 100l and 100r. Thus, by lowering the peak having high intensity at the optical axis (center of the spot) of the laser light 114 using each reflection surface 116, the intensity of the light density averages out around the spot and at the center of the spot, and the light distribution characteristics can be regulated. In addition, the laser light 114 is sufficiently made eye-safe without being transmitted through the light scattering layer including the light scattering body that scatters laser light. Thus, in the eye-safe light source 1, it is possible to regulate the light distribution characteristics of the laser light 114 and at least partially maintain the polarization characteristics of the laser light 114 while making the laser light 114 eye-safe.

Meanwhile, in the related art in PTL 2 to PTL 4, laser light is made eye-safe by transmitting the laser light through a light scattering layer including a light scattering body that scatters laser light. Thus, the laser light loses its light distribution characteristics and polarization characteristics due to multiple scattering while being transmitted through the light scattering layer.

The polarization characteristics of the laser light 114 radiated from the eye-safe light source 1 may be regulated by transmitting the laser light 114 through the light scattering layer. For example, the opening 124 may be covered with a cover, and the type or concentration of a light scattering body included in the cover, or the thickness of the cover may be adjusted. By doing so, the polarization ratio of the laser light 114 radiated from the eye-safe light source 1 through the cover can be adjusted in a range of approximately 2 to 100.

In addition, since the light distribution characteristics can also be regulated using the shape of each reflection surface 116, a lens for regulating the light distribution characteristics does not need to be disposed in the eye-safe light source 1. Thus, this is suitable for thinning the eye-safe light source 1. The lens may be appropriately disposed if necessary. For example, it is desirable to install the lens when the eye-safe light source 1 is used by optically coupling the eye-safe light source 1 to an optic fiber. The lens may be an external lens or may be integrated with the cover covering the opening 124.

The laser light 114 that is made eye-safe at least partially maintains its polarization characteristics at the time of emission from the semiconductor laser 100. Thus, the eye-safe light source 1 is suitable for its application that uses the polarization characteristics of the eye-safe light source 1. For example, the eye-safe light source 1 may be included in an electronic device for biometric authentication.

Modification Example 1

Hereinafter, Modification Example 1 of the first embodiment where a cover 128a is disposed on the opening 124 in the eye-safe light source 1 according to the first embodiment will be described based on FIG. 2.

Figure 2:
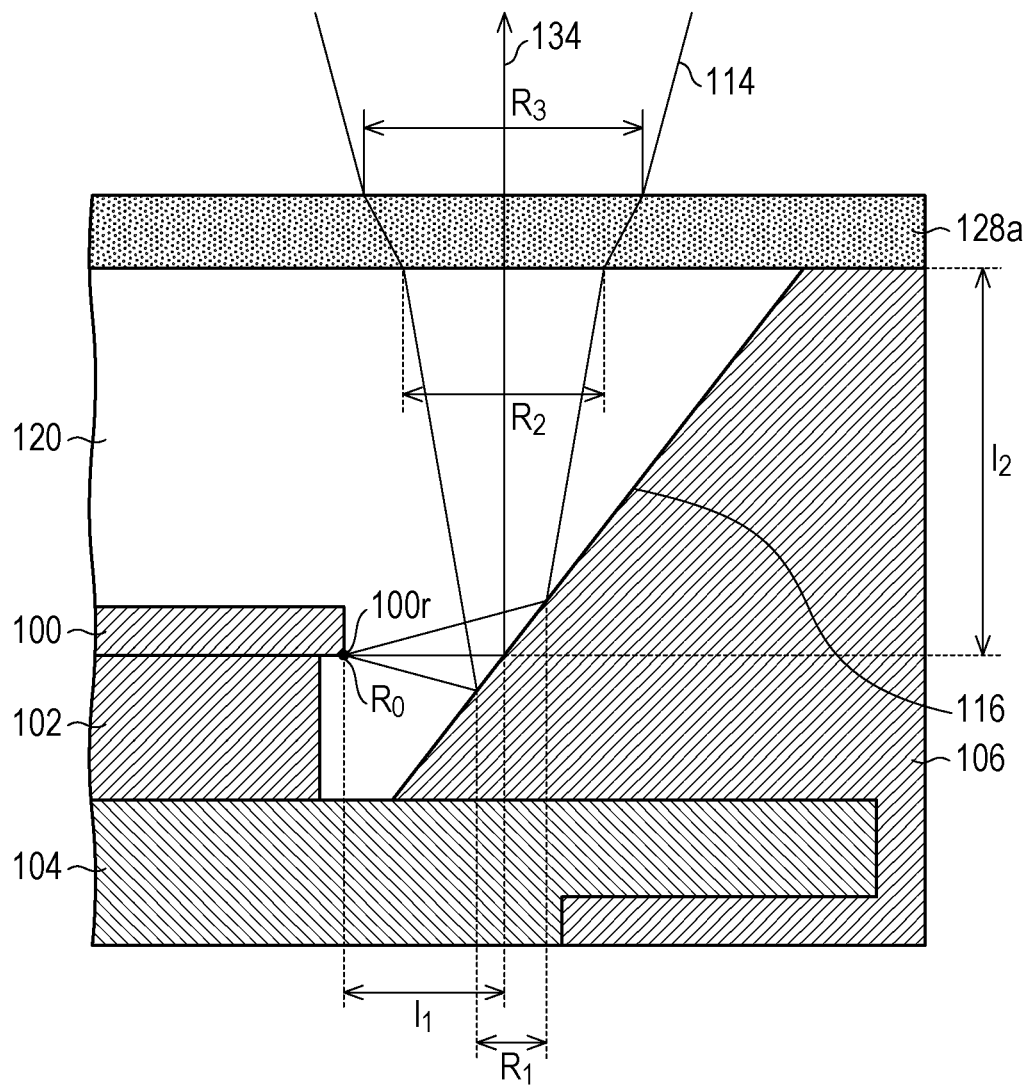
FIG. 2 is a sectional view for describing how to make laser light eye-safe in a modification example where a cover that scatters laser light is disposed in the eye-safe light source illustrated in FIG. 1.

FIG. 2 is a sectional view for describing how to make the laser light 114 eye-safe in the modification example where the cover 128a that scatters the laser light 114 is disposed in the eye-safe light source 1 illustrated in FIG. 1. FIG. 2 corresponds to the right side part of Part (b) of FIG. 1 and illustrates spreading of the laser light 114 and an optical axis 134 of the laser light 114. The range of spreading of the laser light 114 illustrated in FIG. 2 is a range in which the intensity of the light density is 1/e (e is the base of the natural logarithm) of the peak value to the peak value.

The cover 128a is a cover that is disposed to prevent a foreign object from entering the inside of the recessed part 120. The cover 128a is formed with a resin including a light scattering body that scatters the laser light 114. In addition, while illustration is not provided, a vent hole is disposed in the cover 128a. Thus, gas inside the recessed part 120 can flow through the vent hole. Since the cover 128a is formed with a resin including a light scattering body, the spot diameter of the laser light 114 is increased as illustrated in FIG. 2 in the modification example where the cover 128a is disposed.

As illustrated in FIG. 2, the optical axis 134 is the optical axis of the laser light 114. A spot diameter $R_0$ is the spot diameter of the laser light 114 on the right light emission end surface 100r. A spot diameter $R_1$ is the spot diameter of the laser light 114 seen from the direction of the optical axis 118 when the laser light 114 hits the reflection surface 116. A spot diameter $R_2$ is the spot diameter of the laser light 114 when the laser light 114 is incident on the cover 128a. A spot diameter $R_3$ is the spot diameter of the laser light 114 after the laser light 114 passes through the cover 128a.

An optical path length $l_1$ is the optical path length of the laser light 114 from the right light emission end surface 100r to the reflection surface 116 along the optical axis 134 of the laser light 114. An optical path length $l_2$ is the optical path length of the laser light 114 from the reflection surface 116 to the cover 128a along the optical axis 134 of the laser light 114.

The laser light 114 is emitted to spread from the right light emission end surface 100r of the semiconductor laser 100 at a certain angle from the spot diameter $R_0$ in micrometers. Thus, the spot diameter of the laser light 114 is increased while the laser light 114 proceeds parallel to the upper surface of the lead frame 104. When the laser light 114 reaches the reflection surface 116 after proceeding the optical path length $l_1$, the laser light 114 spreads to the spot diameter $R_1$. Accordingly, as in a case where the cover 128a is not disposed, the laser light 114 is made eye-safe by an increase in spot diameter as the distance (optical path length $l_1$) between the right light emission end surface 100r of the semiconductor laser 100 and the reflection surface 116 is increased.

The laser light 114 that reaches the reflection surface 116 is diffusely reflected by the reflection surface 116. The diffuse reflection causes the light density to average out within the spot of the laser light 114, and the laser light 114 is further made eye-safe.

The laser light 114 that is diffusely reflected proceeds straight from the reflection surface 116 to the cover 128a while spreading. When the laser light 114 reaches the cover 128a after proceeding the optical path length $l_2$, the laser light 114 spreads to the spot diameter $R_2$. Accordingly, the laser light 114 is further made eye-safe by the increase in spot diameter as the distance (optical path length $l_2$) between the reflection surface 116 and the cover 128a is increased.

The laser light 114 that is incident on the cover 128a is refracted by a difference in refractive index between the resin forming the cover 128a and gas (air) filling the inside of the recessed part 120. Furthermore, the resin forming the cover 128a includes a light scattering body that scatters the laser light 114. Accordingly, due to the refraction and the scattering, the spot diameter of the laser light 114 is increased to the spot diameter $R_3$ at the time of emission from the spot diameter $R_2$ at the time of incidence while the laser light 114 passes through the cover 128a. In addition, the scattering causes the light density to further average out within the spot of the laser light 114. In this case, the polarization characteristics of the laser light 114 at the time of emission from the semiconductor laser 100 can be partially maintained by adjusting the type and concentration of the light scattering body included in the resin, the thickness of the cover 128a, and the like. Accordingly, the polarization characteristics of eye-safe light emitted by the eye-safe light source 2 can be adjusted, and the polarization ratio, for example, can be adjusted in a range of 2 to 100.

In a case where the cover 128a is not disposed, the virtual light source in which the laser light 114 is made eye-safe is the reflection surface 116, and the spot diameter of the virtual light source is the spot diameter $R_1$ on the reflection surface 116. Meanwhile, in the present modification example where the cover 128a is disposed, the virtual light source in which the laser light 114 is made eye-safe is the cover 128a, and the spot diameter of the virtual light source is the spot diameter $R_3$ on the cover 128a. Accordingly, when the present modification example is compared with a case where the cover 128a is not disposed, the spot diameter of the laser light 114 is increased due to the optical path length $l_2$, and an increase in the spot diameter of the laser light 114 caused by scattering in the cover 128a proceeds in parallel with averaging out of the light density within the spot of the laser light 114 caused by scattering.

In the modification example where the cover 128a that scatters the laser light 114 is disposed in the eye-safe light source 1 according to the first embodiment, light that is radiated from the eye-safe light source 1 is further sufficiently made eye-safe.

Modification Example 2

Hereinafter, Modification Example 2 of the first embodiment where a cover 128b is disposed on the opening 124 in the eye-safe light source 1 according to the first embodiment will be described based on FIG. 3.

Figure 3:
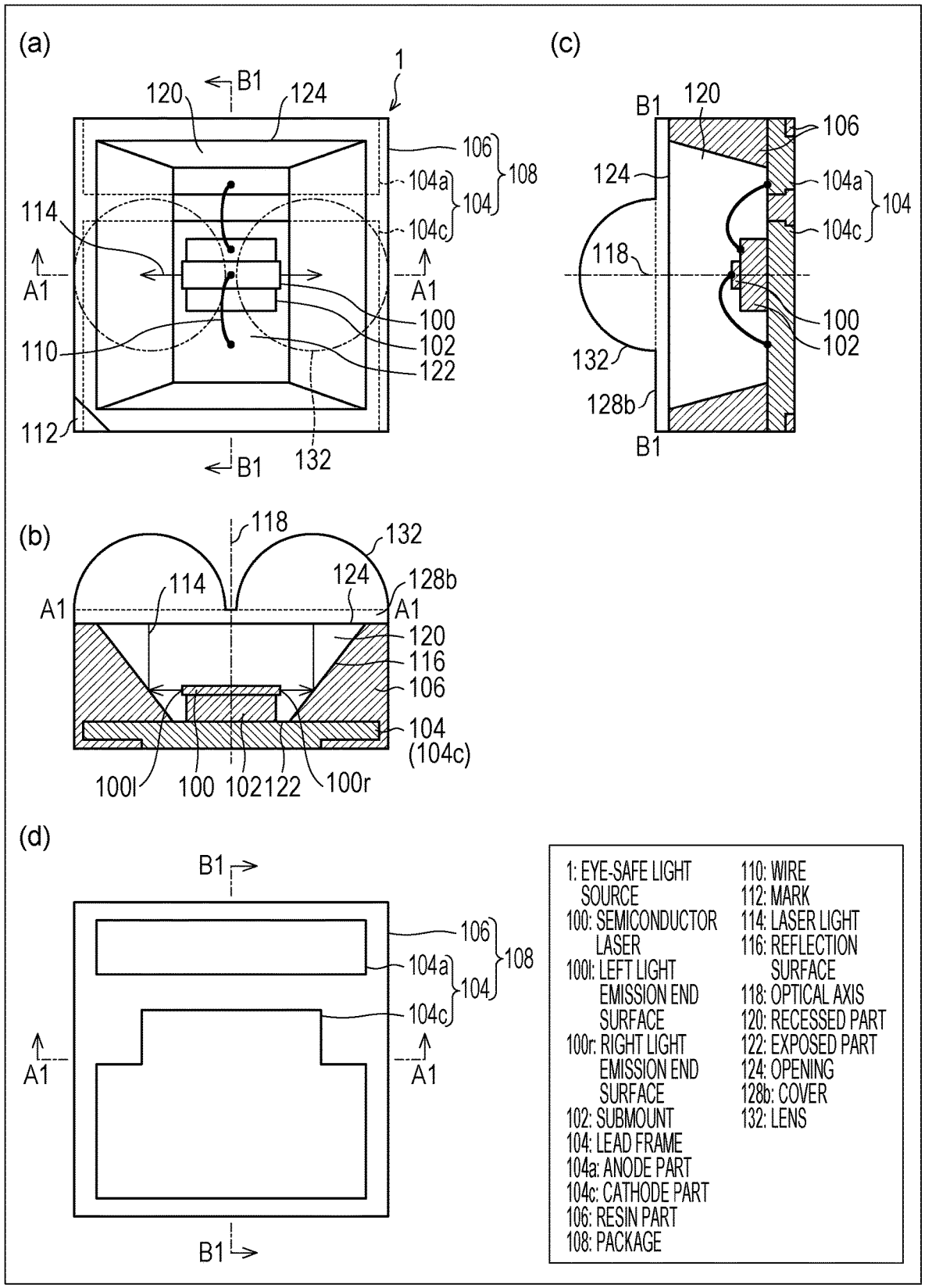
FIG. 3 is a diagram illustrating a modification example where a cover having a lens that collimates laser light is disposed in the eye-safe light source illustrated in FIG. 1.

FIG. 3 is a diagram illustrating the modification example where the cover 128b having lenses 132 that collimate the laser light 114 is disposed in the eye-safe light source illustrated in FIG. 1.

The cover 128b is a cover that is disposed to prevent a foreign object from entering the inside of the recessed part 120. The cover 128b is formed with a resin that does not include a light scattering body. In addition, a vent hole (not illustrated) is disposed in the cover 128b. Thus, gas inside the recessed part 120 can flow through the vent hole. By causing the gas to flow through the vent hole, a difference in pressure between the inside and the outside of the recessed part 120 caused by a rapid change in temperature (a difference in pressure between the inside of the recessed part 120 and the outside of the package 108 and the cover 128b) can be suppressed. By suppressing a difference in pressure between the inside and the outside of the recessed part 120, it is possible to prevent the cover from being detached. For example, a temperature profile in a reflow soldering step is considered as a rapid change in temperature. The cover 128b is integrated with the lens 132 for the laser light 114 emitted from the left light emission end surface 100l and the lens 132 for the laser light 114 emitted from the right light emission end surface 100r.

One lens 132 is formed to collimate the laser light 114 emitted from the left light emission end surface 100l. The other lens 132 is formed to collimate the laser light 114 emitted from the right light emission end surface 100r. Each lens 132 may be an aspheric lens or a spherical lens.

In Modification Example 2 of the first embodiment where the cover 128b having the lenses 132 is disposed, the light distribution characteristics of light radiated from the eye-safe light source 1 are regulated further than those in a case where the cover 128b is not disposed. Thus, the eye-safe light source 1 according to Modification Example 2 of the first embodiment is suitable for its application in which the eye-safe light source 1 is optically coupled to an optic fiber.

Each lens 132 may be an external lens that is not integrated with the cover 128b. In a case where each lens 132 is an external lens, the light distribution characteristics of light radiated from the eye-safe light source 1 are easily adjusted.

Second Embodiment

Another embodiment of the invention will be described as follows based on FIG. 4. For convenience of description, members having the same function as the members described in the above embodiment will be designated by the same reference signs, and descriptions of such members will not be repeated.

Figure 4:
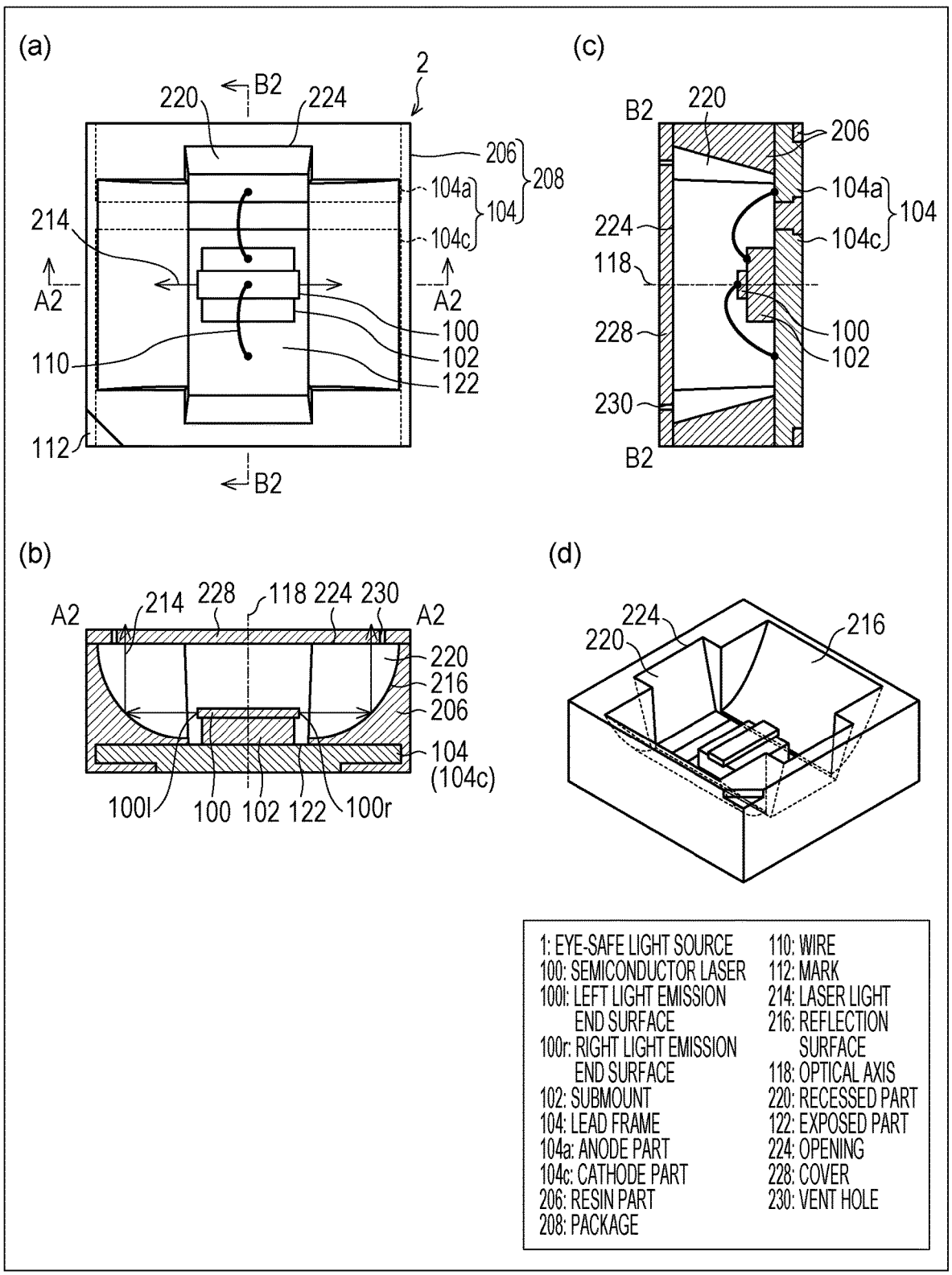
FIG. 4 is a diagram illustrating a schematic configuration around a semiconductor laser of an eye-safe light source according to a second embodiment of the invention. Part (a) of FIG. 4 is a top view without a cover with a resin part seen through. Part (b) of FIG. 4 is an A2-A2 sectional view of Part (a) of FIG. 4. Part (c) of FIG. 4 is a B2-B2 sectional view of Part (a) of FIG. 6. Part (d) of FIG. 4 is a perspective view without the cover for illustrating the three-dimensional shape of the resin part.

FIG. 4 is a diagram illustrating a schematic configuration around the semiconductor laser 100 of an eye-safe light source 2 according to a second embodiment of the invention. Part (a) of FIG. 4 is a top view without a cover 228 with a resin part 206 seen through. Part (b) of FIG. 4 is an A2-A2 sectional view of Part (a) of FIG. 4. Part (c) of FIG. 4 is a B2-B2 sectional view of Part (a) of FIG. 4. Part (d) of FIG. 4 is a perspective view without the cover 228 for illustrating the three-dimensional shape of the resin part 206.

As illustrated in FIG. 4, the eye-safe light source 2 includes the semiconductor laser 100, the submount 102, a package 208, the wires 110, and the cover 228. The semiconductor laser 100 emits laser light 214. The semiconductor laser 100 is mounted on the submount 102. The package 208 has the lead frame 104 and the resin part 206. The cover 228 has vent holes 230. The mark 112 is disposed to indicate the directions of the anode and the cathode.

There are two differences between the eye-safe light source 1 according to the first embodiment and the eye-safe light source 2 according to the second embodiment.

One difference is that while the opening 124 is open in the eye-safe light source 1 according to the first embodiment, an opening 224 is covered with the cover 228 having the vent holes 230 in the eye-safe light source 2 according to the second embodiment.

Another difference is that while the shape of the recessed part 120 included in the resin part 106 is a three-dimensional shape such as an approximately reversed quadrangular truncated pyramid in the eye-safe light source 1 according to the first embodiment, the shape of a recessed part 220 included in the resin part 206 is a three-dimensional shape in which an approximately reversed quadrangular truncated pyramid is combined with an approximately semicylindrical shape in the eye-safe light source 2 according to the second embodiment.

That is, the eye-safe light source 2 according to the second embodiment is different from the eye-safe light source 1 according to the first embodiment in that the eye-safe light source 2 includes the cover 228 having the vent holes 230 and has a different shape of the recessed part 220 of the resin part 206.

(Recessed Part)

Hereinafter, the recessed part 220 included in the resin part 206 will be described.

The shape of the recessed part 220 is a three-dimensional shape in which an approximately reversed quadrangular truncated pyramid is combined with an approximately semicylindrical shape such that the upper edges of the approximately reversed quadrangular truncated pyramid are in the same plane as the section of the approximately semicylindrical shape cut from a cylinder. Each reflection surface 216 that diffusely reflects the laser light 214 is a curved surface part of the approximately semicylindrical shape. The exposed part 122 on the upper surface of the lead frame 104 is exposed from the lower edge part of the approximately reversed quadrangular truncated pyramid. Accordingly, as is understood from Part (b) of FIG. 1 and Part (b) of FIG. 4, while the reflection surfaces 116 according to the first embodiment are side surfaces (flat surfaces) of the approximately reversed quadrangular truncated pyramid that face each other, the reflection surfaces 216 according to the second embodiment are curved surfaces.

More specifically, each reflection surface 216 is a part of a curved surface that is drawn by the trajectory of movement of a parabola when the parabola is translated in a direction perpendicular to a plane including the parabola. In the present embodiment, while the plane including the parabola is parallel to the optical axis 118 and the direction of emission of the laser light 214 by the semiconductor laser 100, and the axis of symmetry of the parabola is parallel to the optical axis 118, the axis of symmetry of the parabola is not limited thereto. The axis of symmetry of the parabola may also be inclined with respect to the optical axis 118. For example, the reflection surface 216 that faces the right light emission end surface 100r is a part of a curved surface acquired by translating a parabola of which the focus is at the light emission center of the right light emission end surface 100r. Similarly, the reflection surface 216 that faces the left light emission end surface 1001 is a part of a curved surface acquired by translating a parabola of which the focus is at the light emission center of the left light emission end surface 1001.

In other words, the position of the focus of the parabola forming each reflection surface 216 in Part (b) of FIG. 4 matches the position of the light emission center of each light emission end surface (the left light emission end surface 1001 or the right light emission end surface 100r) facing each reflection surface 216.

In a case where the semiconductor laser 100 is very small, for example, in a case where the resonator length of the semiconductor laser 100 is shorter than 300 µm, the size of the semiconductor laser 100 may be ignored, and the reflection surfaces 216 facing the left light emission end surface 1001 and the right light emission end surface 100r may be a part of a curved surface acquired by translating a parabola of which the focus is at the middle point between the light emission centers of the right light emission end surface 100r and the left light emission end surface 1001. In this case, care should be taken not to set a too short distance from the left and right light emission end surfaces 1001 and 100r to the reflection surfaces 216, and it is important to set an appropriate distance. When the reflection surfaces 216 are too close to the left and right light emission end surfaces 1001 and 100r, the intensity per unit area of the laser light 214 is rapidly increased. Even when the laser light 214 is infrared light, the laser light 214 may thermally damage each reflection surface 216 that is composed of a resin. Securing an appropriate distance between the left light emission end surface 1001 and the reflection surface 216, and between the right light emission end surface 100r and the reflection surface 216 is also important in order to avoid thermal damage.

As in a case where the semiconductor laser 100 is sufficiently small, the simple approach described above can also be applied in the case of a long resonator length such as 0.5 mm or longer than 1 mm. Even in this case, the left and right light emission end surfaces 1001 and 100r need to be sufficiently away from the reflection surfaces 216 in order to avoid thermal damage. However, in such a simple structure, the position of the light emission center of each of the left and right light emission end surfaces 1001 and 100r is significantly separated from the position of the focus of the parabola forming the reflection surfaces 216. Such separation causes the laser light 214 after reflection to be significantly inclined from the optical axis 118. Thus, in a case where the semiconductor laser 100 is a semiconductor laser having a long resonator length, it is desirable to dispose the reflection surfaces 216 that are parts of paraboloids of which the focuses independently match the light emission centers of the left and right light emission end surfaces 1001 and 100r, in order to approximate the laser light 114 on the left and right sides after reflection to be parallel to the optical axis 118.

Each reflection surface 216 may also be a part of a curved surface that is composed of other approximately parabolic lines. For example, each reflection surface 216 may be a part of a cylindrical surface that can be approximated to a surface acquired by translating a parabola.

Since each reflection surface 216 is a part of a curved surface composed of a parabola, the laser light 214 that is emitted to spread from the left light emission end surface 1001 and the right light emission end surface 100r can be collimated. Thus, the laser light 214 that is made eye-safe and emitted from the opening 224 has excellent directivity.

On the contrary, in order to increase the half angle of the light distribution characteristics of the laser light 214 that is made eye-safe and emitted from the opening 224 to a predetermined angle, the focus of the parabola forming each reflection surface 216 may be separated from the right light emission end surface 100r and the left light emission end surface 1001.

The heights of the right light emission end surface 100r and the left light emission end surface 1001 with respect to the reflection surfaces 216 (in other words, the heights of the light emission centers of the left and right light emission end surfaces 1001 and 100r with respect to the focuses of the parabolas forming the reflection surface 216) can be easily adjusted by adjusting the height of the submount 102.

The distance to the right light emission end surface 100r and the left light emission end surface 1001 from the reflection surfaces 216 in a direction parallel to the upper surface of the lead frame 104 (in other words, the distance of the light emission centers of the left and right light emission end surfaces 1001 and 100r with respect to the focuses of the parabolas forming the reflection surfaces 216 in a direction parallel to the lead frame 104) can be easily changed by changing the resonator length of the semiconductor laser 100.

The distance to the left and right light emission end surfaces 100l and 100r from the focuses of the parabolas forming the reflection surfaces 216 can be changed without changing the design of the shape of the recessed part 220, by simply changing the height of the submount 102 or the resonator length of the semiconductor laser 100. Thus, the light distribution characteristics can be easily adjusted. That is, an eye-safe light source having various light distributions such as a narrow beam and a highly oriented beam can be easily prepared depending on its purpose.

(Cover)

Hereinafter, the cover 228 will be described.

The cover 228 is a cover that is disposed to prevent a foreign object from entering the inside of the recessed part 220. The cover 228 is formed with a resin that does not include a light scattering body. In addition, while illustration is not provided, the vent holes 230 are disposed in the cover 228. Thus, gas inside the recessed part 220 can flow through the vent holes 230. Accordingly, in a case where gas inside the recessed part 220 thermally expands due to heat generated by the semiconductor laser 100, the gas inside the recessed part 220 escapes to the outside of the cover 228. Similarly, in a case where gas inside the recessed part 220 thermally contracts after heat is not generated from the semiconductor laser 100, the inside of the recessed part 220 is refilled with gas from the outside of the cover 228. For example, such vent holes can contribute to suppressing a difference in pressure between the inside and the outside of the recessed part 220 in the case of a rapid change in temperature caused by a temperature profile in a reflow soldering step.

Accordingly, expansive pressure and compressive pressure are not generated in the recessed part 220, and stress caused by expansion and contraction of gas inside the recessed part 220 is not applied to the cover 228. Thus, since strength for enduring stress is not needed, the cover 228 can be thinned. In addition, since strength for enduring stress is not needed, the degree of freedom in designing the shape of the cover 228 is increased.

Even in a case where the cover 228 is bonded to the package 208, stress caused by expansion and contraction of gas is not concentrated in the bonded part when the vent holes 230 are disposed in the cover 228. Thus, it is possible to prevent the cover 228 from being peeled from the package 208. While the vent holes 230 are considered to be installed in the cover 228 in the second embodiment, the same effect is achieved even when the vent holes 230 are disposed in the package 208.

In order to prevent deterioration of the semiconductor laser 100, the semiconductor laser 100 may be gas-sealed inside the recessed part 220 by covering the opening 224 with a cover not having vent holes. For example, in the case of a blue semiconductor laser, gas-sealing with inert gas is needed in order to prevent a breakage in the end surface. For example, in the case of a vehicle-mounted light source that needs high reliability, gas-sealing is needed. For example, in the case of using the semiconductor laser in an environment where the semiconductor laser needs to be protected from an environment where condensation occurs, gas-sealing is needed. In the case of gas-sealing, airtightness needs to be secured by employing a structure or material having high airtightness in the package 208, especially the resin part 206, or by enclosing the package 208 in a container having high airtightness.

Even in a case where the semiconductor laser 100 is gas-sealed with inert gas, substances causing thermal and optical damage or substances generating heat by absorbing light are not present in the vicinity of both end surfaces of the semiconductor laser 100 emitting the laser light 214 as in the first embodiment. Thus, deterioration of the function of the eye-safe light source 2 caused by modification of substances in the vicinity of both end surfaces of the semiconductor laser 100 is prevented. In addition, since the semiconductor laser 100 is not resin-sealed and is joined to the lead frame 104 with the submount 102 in between, the semiconductor laser 100 can expand and contract depending on changes in temperature.

Modification Example 3

The cover 228 may also be formed with a resin that includes a light scattering body. Hereinafter, Modification Example 3 of the second embodiment where a cover 228b formed with a resin including a light scattering body that scatters the laser light 214 is disposed in the eye-safe light source 2 according to the second embodiment instead of the cover 228 formed with a resin not including a light scattering body will be described based on FIG. 5.

Figure 5:
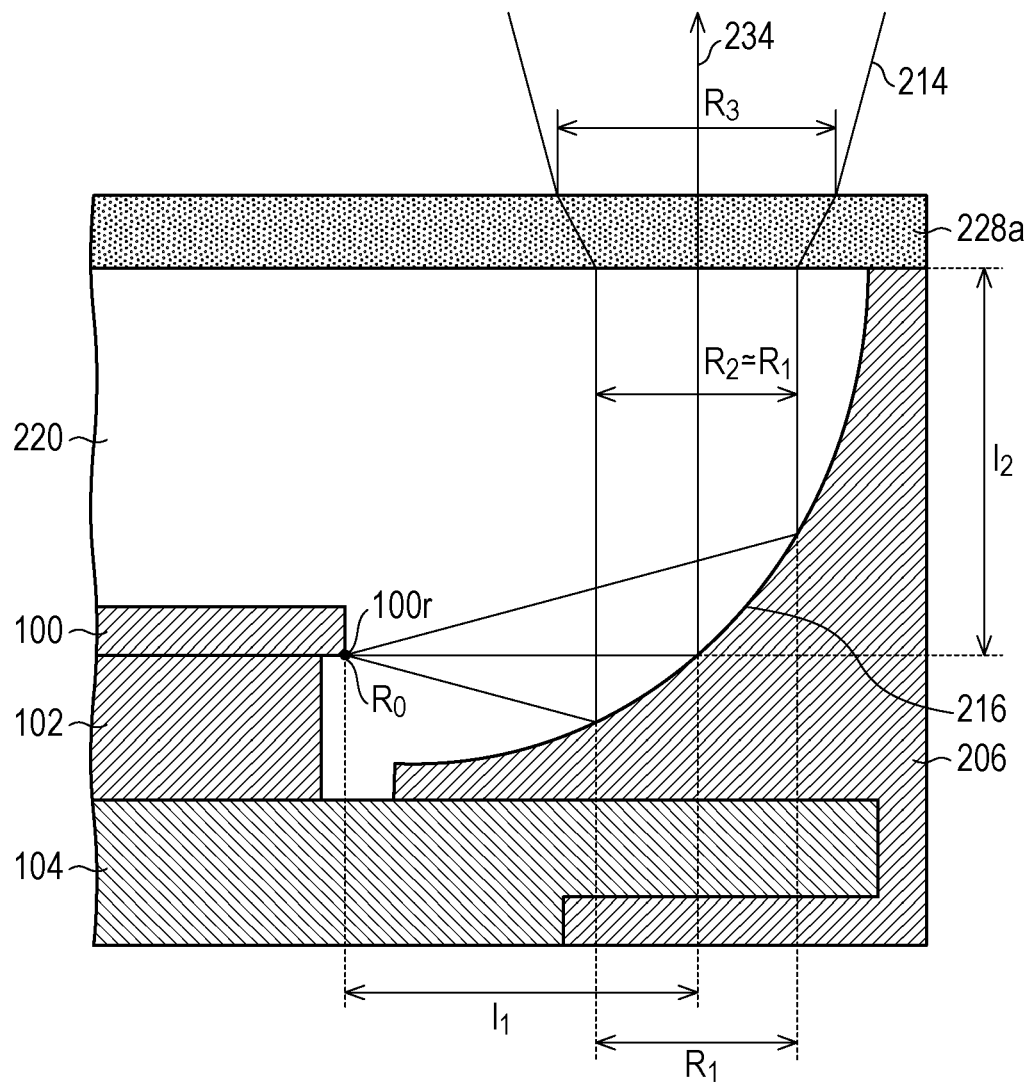
FIG. 5 is a sectional view for describing how to make laser light eye-safe in a modification example where a cover 228a that scatters laser light is disposed in the eye-safe light source illustrated in FIG. 4.

FIG. 5 is a sectional view for describing how to make the laser light 214 eye-safe in the modification example where the cover 228a that scatters the laser light 214 is disposed in the eye-safe light source 2 illustrated in FIG. 4. FIG. 5 corresponds to the right side part of Part (b) of FIG. 4 and illustrates spreading of the laser light 214 and an optical axis 234 of the laser light 214. The range of spreading of the laser light 214 illustrated in FIG. 5 is a range in which the intensity of the light density is 1/e (e is the base of the natural logarithm) of the peak value to the peak value.

The cover 128a is equivalent to the cover 228 except that the cover 228a is formed with a resin including a light scattering body that scatters the laser light 214.

As illustrated in FIG. 5, the optical axis 234 is the optical axis of the laser light 214. The spot diameter $R_0$ is the spot diameter of the laser light 214 on the right light emission end surface 100r. The spot diameter $R_1$ is the spot diameter of the laser light 214 seen from the direction of the optical axis 118 when the laser light 214 hits the reflection surface 216. The spot diameter $R_2$ is the spot diameter of the laser light 214 when the laser light 214 is incident on the cover 228a. The spot diameter $R_3$ is the spot diameter of the laser light 214 after the laser light 214 passes through the cover 228a.

The optical path length $l_1$ is the optical path length of the laser light 214 from the right light emission end surface 100r to the reflection surface 216 along the optical axis 234 of the laser light 214. The optical path length $l_2$ is the optical path length of the laser light 214 from the reflection surface 216 to the cover 228a along the optical axis 234 of the laser light 214.

As in Modification Example 1 of the first embodiment, in a case where the cover 228a that is formed with a resin including a light scattering body is disposed, the laser light 214 is scattered while being transmitted through the cover 228a, and the spot diameter of the laser light 214 is increased. Thus, the laser light 214 is further made eye-safe. In this case, the polarization characteristics of the laser light 214 at the time of emission from the semiconductor laser 100 can be partially maintained by adjusting the type and concentration of the scattering body included in the resin, the thickness of the cover 228a, and the like. Accordingly, the polarization characteristics of eye-safe light emitted by the eye-safe light source 2 can be adjusted, and the polarization ratio, for example, can be adjusted in a range of 2 to 100.

Third Embodiment

Another embodiment of the invention will be described as follows based on FIG. 6. For convenience of description, members having the same function as the members described in the above embodiment will be designated by the same reference signs, and descriptions of such members will not be repeated.

Figure 6:
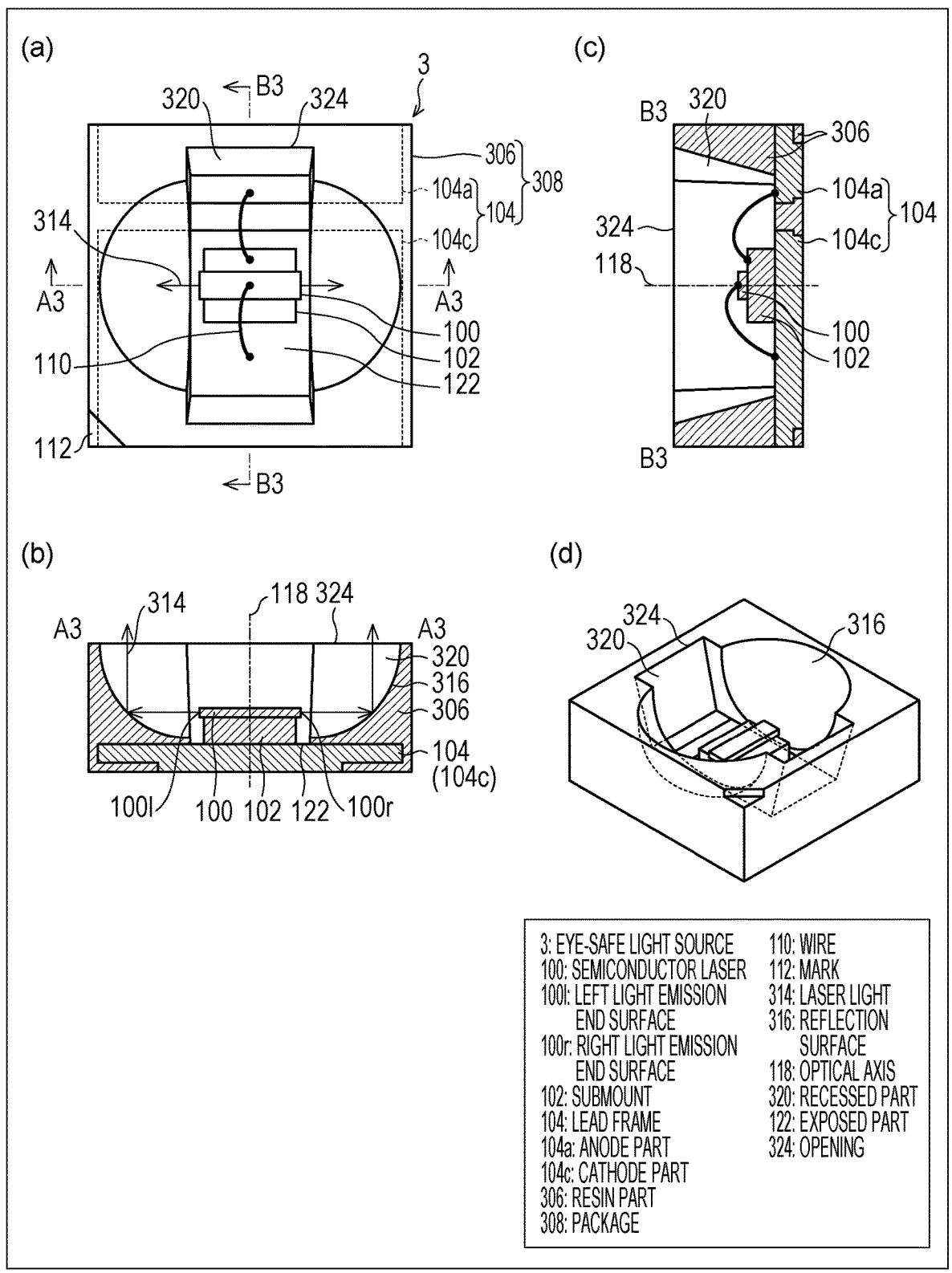
FIG. 6 is a diagram illustrating a schematic configuration around a semiconductor laser of an eye-safe light source according to a third embodiment of the invention. Part (a) of FIG. 6 is a top view with a resin part seen through. Part (b) of FIG. 6 is an A3-A3 sectional view of Part (a) of FIG. 6. Part (c) of FIG. 6 is a B3-B3 sectional view of Part (a) of FIG. 6. Part (d) of FIG. 6 is a perspective view for illustrating the three-dimensional shape of the resin part.

FIG. 6 is a diagram illustrating a schematic configuration around the semiconductor laser 100 of an eye-safe light source 3 according to a third embodiment of the invention. Part (a) of FIG. 6 is a top view with a resin part 306 seen through. Part (b) of FIG. 6 is an A3-A3 sectional view of Part (a) of FIG. 6. Part (c) of FIG. 6 is a B3-B3 sectional view of Part (a) of FIG. 6. Part (d) of FIG. 6 is a perspective view for illustrating the three-dimensional shape of the resin part 306.

As illustrated in FIG. 6, the eye-safe light source 3 includes the semiconductor laser 100, the submount 102, a package 308, and the wires 110. The semiconductor laser 100 emits laser light 314. The semiconductor laser 100 is mounted on the submount 102. The package 308 has the lead frame 104 and the resin part 306. The mark 112 is disposed to indicate the directions of the anode and the cathode.

There is one difference between the eye-safe light source 1 according to the first embodiment and the eye-safe light source 3 according to the third embodiment. That is, while the shape of the recessed part 120 included in the resin part 106 is a three-dimensional shape such as an approximately reversed quadrangular truncated pyramid in the eye-safe light source 1 according to the first embodiment, the shape of a recessed part 320 included in the resin part 306 is a three-dimensional shape in which an approximately reversed quadrangular truncated pyramid is combined with approximately a paraboloid of revolution in the eye-safe light source 3 according to the third embodiment.

(Recessed Part)

Hereinafter, the recessed part 320 included in the resin part 306 will be described.

The shape of the recessed part 320 is a three-dimensional shape in which an approximately reversed quadrangular truncated pyramid is combined with approximately a paraboloid of revolution such that the upper edges of the approximately reversed quadrangular truncated pyramid are in the same plane as the bottom surface of approximately the paraboloid of revolution. Each reflection surface 316 that diffusely reflects the laser light 314 is a part of the curved surface of approximately the paraboloid of revolution. The exposed part 122 on the upper surface of the lead frame 104 is exposed from the lower edge part of the approximately reversed quadrangular truncated pyramid. Accordingly, as is understood from Part (b) of FIG. 1 and Part (b) of FIG. 6, while the reflection surfaces 116 according to the first embodiment are side surfaces (flat surfaces) of the approximately quadrangular truncated pyramid that face each other, the reflection surfaces 316 according to the third embodiment are curved surfaces.

More specifically, each reflection surface 316 is a part of a paraboloid of revolution that is drawn by the trajectory of rotation of a parabola when the parabola is rotated about its axis of symmetry as the axis of rotation. A plane including the parabola is seen in Part (b) of FIG. 6 that is an A3-A3 sectional view of Part (a) of FIG. 6. The sectional shape of each reflection surface 316 illustrated in Part (b) of FIG. 6 is a part of the parabola. While the plane including the parabola in Part (b) of FIG. 6 is parallel to the optical axis 118 and the direction of emission of the laser light 314 by the semiconductor laser 100, and the axis of symmetry of the parabola is parallel to the optical axis 118, the axis of symmetry of the parabola is not limited thereto. The axis of symmetry of the parabola may also be inclined with respect to the optical axis 118. For example, the reflection surface 316 that faces the right light emission end surface 100r is a part of a curved surface acquired by rotating a parabola of which the focus is at the light emission center of the right light emission end surface 100r. Similarly, the reflection surface 316 that faces the left light emission end surface 100l is a part of a curved surface acquired by rotating a parabola of which the focus is at the light emission center of the left light emission end surface 100l.

In a case where the semiconductor laser 100 is very small, for example, in a case where the resonator length of the semiconductor laser 100 is shorter than 300 μm, the size of the semiconductor laser 100 may be ignored, and the reflection surfaces 316 facing the left light emission end surface 100l and the right light emission end surface 100r may be a part of a curved surface acquired by rotating a parabola of which the focus is at the middle point between the light emission centers of the right light emission end surface 100r and the left light emission end surface 100l. Each reflection surface 216 may also be a part of other curved surfaces composed of approximately parabolic lines. For example, each reflection surface 216 may be a part of an elliptic paraboloid or a part of a sphere.

As in a case where the semiconductor laser 100 is sufficiently small, the simple approach described above can also be applied in the case of a long resonator length such as 0.5 mm or longer than 1 mm. Even in this case, the left and right light emission end surfaces 100l and 100r need to be sufficiently away from the reflection surfaces 316 in order to avoid thermal damage. However, in such a simple structure, the position of the light emission center of each of the left and right light emission end surfaces 100l and 100r is significantly separated from the position of the focus of the parabola forming the reflection surfaces 316. Such separation causes the laser light 314 after reflection to be significantly inclined from the optical axis 118. Thus, in a case where the semiconductor laser 100 is a semiconductor laser having a long resonator length, it is desirable to dispose the reflection surfaces 316 that are parts of paraboloids of which the focuses independently match the light emission centers of the left and right light emission end surfaces 100l and 100r, in order to approximate the laser light 114 on the left and right sides after reflection to be parallel to the optical axis 118.

Each reflection surface 316 may also be a part of other curved surfaces composed of approximately parabolic lines. For example, each reflection surface 316 may be a part of an elliptic paraboloid or a part of a sphere. Each reflection surface 316 may also be a spheroid. Each reflection surface 316 is not limited to a paraboloid of revolution, and may also be a sphere that can be approximated to a paraboloid of revolution.

Since each reflection surface 316 is a paraboloid of revolution, the laser light 314 that is emitted to spread can be collimated. Thus, the laser light 314 that is made eye-safe and emitted from the opening 324 has excellent directivity.

Light that is radiated from the eye-safe light source 1 has excellent directivity and also has excellent eye safety properties. The reason is that a region that is recognized as a virtual light source (apparent light source) in the opening 324, that is, the area of a light emission region where the intensity of light observed 10 cm ahead is 1/e (the base of the natural logarithm) of the peak intensity to the peak intensity, is sufficiently wide in the opening 324. That is, since the intensity of light per unit area is decreased, the eye safety properties can be improved consequently.

On the contrary, in order to increase the half angle of the light distribution characteristics of the laser light 314 that is made eye-safe and emitted from the opening 324 to a predetermined angle, the focus of the parabola forming each reflection surface 316 may be separated from the right light emission end surface 100r and the left light emission end surface 100l. A method of changing the height (length in the direction of the optical axis 118) of the submount 102, and a method of changing the resonator length of the semiconductor laser 100 are the easiest methods for separating the focus from the left and right light emission end surfaces 100l and 100r.

In the third embodiment, the axis of symmetry of a parabola is employed as the axis of rotation for rotating the parabola, and a partial shape of the paraboloid of revolution is used as the shape of each reflection surface 316. However, the shape of each reflection surface 316 is not limited to such a partial shape. An axis that is inclined with respect to the axis of symmetry of a parabola may be employed as the axis of rotation, and a partial shape of the surface of a solid of revolution drawn by the trajectory of rotation of the parabola may be used as the shape of each reflection surface 316. In a case where a partial shape of the surface of the solid of revolution of which the axis of rotation is inclined with respect to its axis of symmetry is used for each reflection surface, it is possible to choose whether to decrease or increase the spot diameter using the shape of each reflection surface unlike collimated light that is acquired in a case where the light emission point of the light source is set at the focus of a paraboloid of revolution of which the axis of rotation matches its axis of symmetry.

Even in a case where the shape of each reflection surface 316 is a partial shape of a paraboloid of revolution of which the axis of rotation does not match its axis of symmetry, the same effect can be expected by separating the position of the light emission center of each of the left and right light emission end surfaces 100l and 100r from the focus as described above. In this case, when the position of the light emission point is separated in a direction parallel to the axis of symmetry, the position of the light emission point is restricted in a height direction (the thickness direction of the package) by the thickness of the package. When the position of the light emission point is separated in a direction orthogonal to the axis of symmetry, the position of the light emission point is restricted by the resonator length of the semiconductor laser 100. Accordingly, the ratio of increase or decrease in spot diameter is restricted. Meanwhile, in a case where a part of the surface of a solid of revolution of which the axis of rotation is an axis inclined with respect to the axis of symmetry of a parabola is used as the shape of each reflection surface 316, the ratio of increase or decrease in spot diameter can be decided by choosing an appropriate axis of rotation. Thus, restrictions caused by the thickness of the package and the resonator length are reduced.

Fourth Embodiment

Another embodiment of the invention will be described as follows based on FIG. 7. For convenience of description, members having the same function as the members described in the above embodiment will be designated by the same reference signs, and descriptions of such members will not be repeated.

Figure 7:
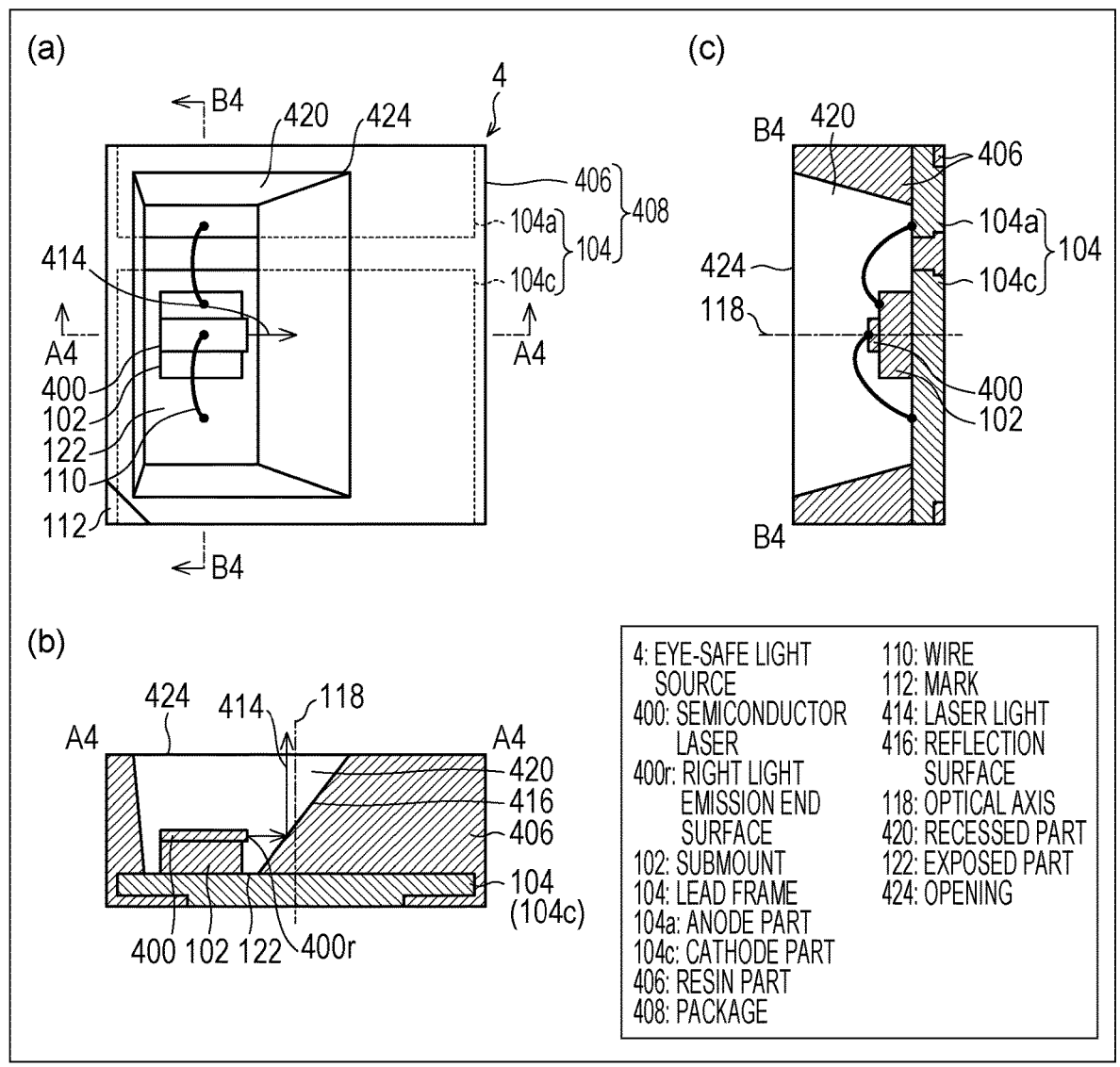
FIG. 7 is a diagram illustrating a schematic configuration around a semiconductor laser of an eye-safe light source according to a fourth embodiment of the invention. Part (a) of FIG. 7 is a top view with a resin part seen through. Part (b) of FIG. 7 is an A4-A4 sectional view of Part (a) of FIG. 7. Part (c) of FIG. 7 is a B4-B4 sectional view of Part (a) of FIG. 7.

FIG. 7 is a diagram illustrating a schematic configuration around a semiconductor laser 400 of an eye-safe light source 4 according to a fourth embodiment of the invention. Part (a) of FIG. 7 is a top view with a resin part 406 seen through. Part (b) of FIG. 7 is an A4-A4 sectional view of Part (a) of FIG. 7. Part (c) of FIG. 7 is a B4-B4 sectional view of Part (a) of FIG. 7.

As illustrated in FIG. 7, the eye-safe light source 4 includes the semiconductor laser 400, the submount 102, a package 408, and the wires 110. The semiconductor laser 400 emits laser light 414. The semiconductor laser 400 is mounted on the submount 102. The package 408 has the lead frame 104 and the resin part 406. The mark 112 is disposed to indicate the directions of the anode and the cathode.

There are two differences between the eye-safe light source 1 according to the first embodiment and the eye-safe light source 4 according to the fourth embodiment.

One difference is that while the semiconductor laser 100 emits the laser light 114 from its light emission end surfaces on both of the left and right sides (the left light emission end surface 100l and the right light emission end surface 100r) in the eye-safe light source 1 according to the first embodiment, the semiconductor laser 100 emits the laser light 414 only from its light emission end surface on the right side (right light emission end surface 400r) in the eye-safe light source 4 according to the fourth embodiment.

Another difference is that while the shape of the recessed part 120 included in the resin part 106 is a shape such as an approximately symmetric quadrangular truncated pyramid in the eye-safe light source 1 according to the first embodiment, the shape of a recessed part 420 included in the resin part 406 is a three-dimensional shape such as an approximately asymmetric quadrangular truncated pyramid in the eye-safe light source 4 according to the fourth embodiment. That is, the recessed part 120 according to the first embodiment has plane symmetry about a plane that passes through the center of the semiconductor laser 100 and is perpendicular to the upper surface of the lead frame 104 and the direction of emission of the laser light 114 from the semiconductor laser 100. Meanwhile, the recessed part 420 according to the fourth embodiment does not have plane symmetry about a plane that passes through the center of the semiconductor laser 400 and is perpendicular to the upper surface of the lead frame 104 and the direction of emission of the laser light 414 from the semiconductor laser 400.

That is, the eye-safe light source 4 according to the fourth embodiment is different from the eye-safe light source 1 according to the first embodiment in that the eye-safe light source 4 uses the semiconductor laser 400 that emits the laser light 414 to only one side. Accordingly, the shape of the recessed part 420 is different.

(Recessed Part)

Hereinafter, the recessed part 420 included in the resin part 406 will be described.

The recessed part 420 is formed to have upper edges (opening 424) having an oblong shape open on the upper surface of the package 408, lower edges having an oblong shape where the exposed part 122 of the lead frame 104 is exposed, and four trapezoidal side surfaces extending between the upper edges and the lower edges. The area of the upper edges is larger than the area of the lower edges. The recessed part 420 may have other shapes such as an approximately symmetric quadrangular truncated pyramid, an approximately symmetric circular truncated cone, and an approximately asymmetric circular truncated cone.

A reflection surface 416 is one side surface among four side surfaces of the recessed part 420. The reflection surface 416 faces the right light emission end surface 400r of the semiconductor laser 400 from which the laser light 414 is emitted. The reflection surface 416 has plane symmetry about a plane that passes through the center of the semiconductor laser 100 and is perpendicular to the upper surface of the lead frame 104 and parallel to the direction of emission of the laser light 114 by the semiconductor laser 100. In addition, the reflection surface 416 is a flat surface that is inclined upward with respect to the upper surface of the lead frame 104.

Thus, the reflection surface 416 according to the fourth embodiment diffusely reflects the laser light 414 in the direction of the optical axis 118 in the same manner as the reflection surfaces 116 according to the first embodiment. While a direction perpendicular to the upper surface of the lead frame 104 is employed as the optical axis 118 in the fourth embodiment, another new optical axis of the eye-safe light source in a direction inclined with respect to the optical axis 118 illustrated here can also be employed by changing the inclination of the reflection surface 416.

(Wire)

For the wires 110, it is desirable that the wires 110 do not cast shadows on the virtual light source. Thus, the wires 110 may also be disposed to extend in a direction that is parallel and opposite to the direction of emission of the laser light 414 from the semiconductor laser 100.

Application Example 1

In the eye-safe light sources 1 to 3 of the first to third embodiments illustrated in FIG. 1 to FIG. 6, a semiconductor laser in which light emission on the left and right light emission surfaces is asymmetric may be used instead of the semiconductor laser 100. For example, such a semiconductor laser can be easily acquired by setting different reflectance for the end surface coats on the left and right sides. By doing so, for example, light emission on the left and right sides can be changed like 40 to 60, 30 to 70, 20 to 80, and 10 to 90.

In order to implement the eye-safe light source having one light emission point illustrated in FIG. 4, for example, it is considered that a semiconductor laser having an asymmetric light emission ratio of 5 to 95 on the left and right sides is used.

Application Example 2

For example, it is desirable to install the lens when the eye-safe light source 1 is used by optically coupling the eye-safe light source 1 to an optic fiber. In such an application, for the purpose of further regulating the light distribution characteristics, the opening 124 may be covered with a cover to which a lens is attached as in FIG. 8, or the light distribution characteristics may be adjusted using an external lens. Even in the eye-safe light source according to the first to third embodiments of the invention, a lens may be installed when the eye-safe light source 1 is used by optically coupling the eye-safe light source 1 to an optic fiber.

Figure 8:
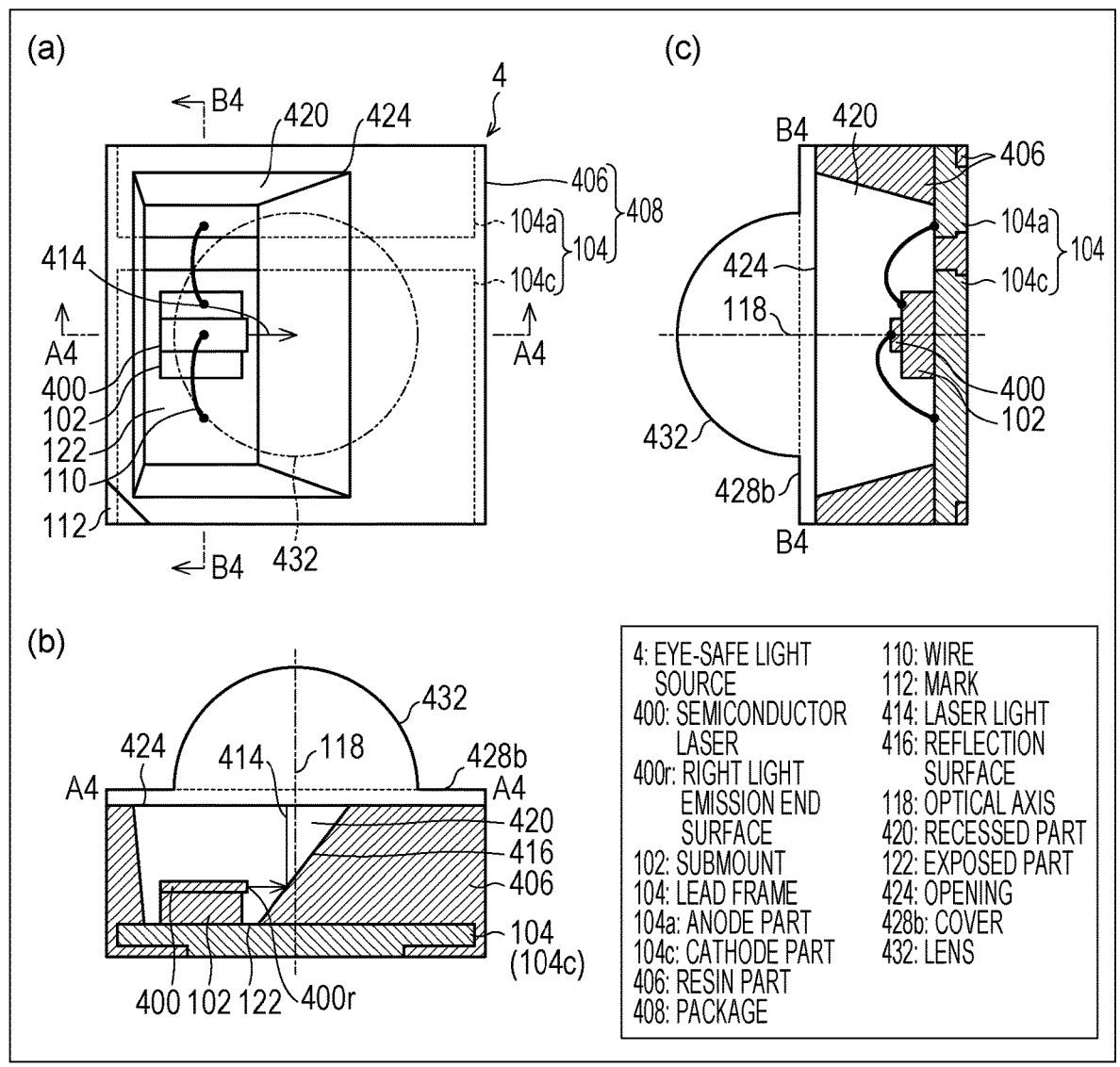
FIG. 8 is a diagram illustrating a modification example where a cover having a lens that collimates laser light is disposed in an eye-safe light source 4 illustrated in FIG. 7.

FIG. 8 is a diagram illustrating the modification example where a cover 428b having a lens 432 that collimate the laser light 414 is disposed in the eye-safe light source 4 illustrated in FIG. 7.

The cover 428b is a cover that is disposed to prevent a foreign object from entering the inside of the recessed part 420. The cover 428b is formed with a resin that does not include a light scattering body. In addition, a vent hole (not illustrated) is disposed in the cover 128b. Thus, gas inside the recessed part 420 can flow through the vent hole. The cover 428b is integrated with the lens 432 for the laser light 414 emitted from the right light emission end surface 400r.

The lens 432 is formed to collimate the laser light 414 emitted from the right light emission end surface 400r. The lens 432 may be an aspheric lens or a spherical lens.

Fifth Embodiment

Another embodiment of the invention will be described as follows based on FIG. 9. For convenience of description, members having the same function as the members described in the above embodiment will be designated by the same reference signs, and descriptions of such members will not be repeated.

Figure 9:
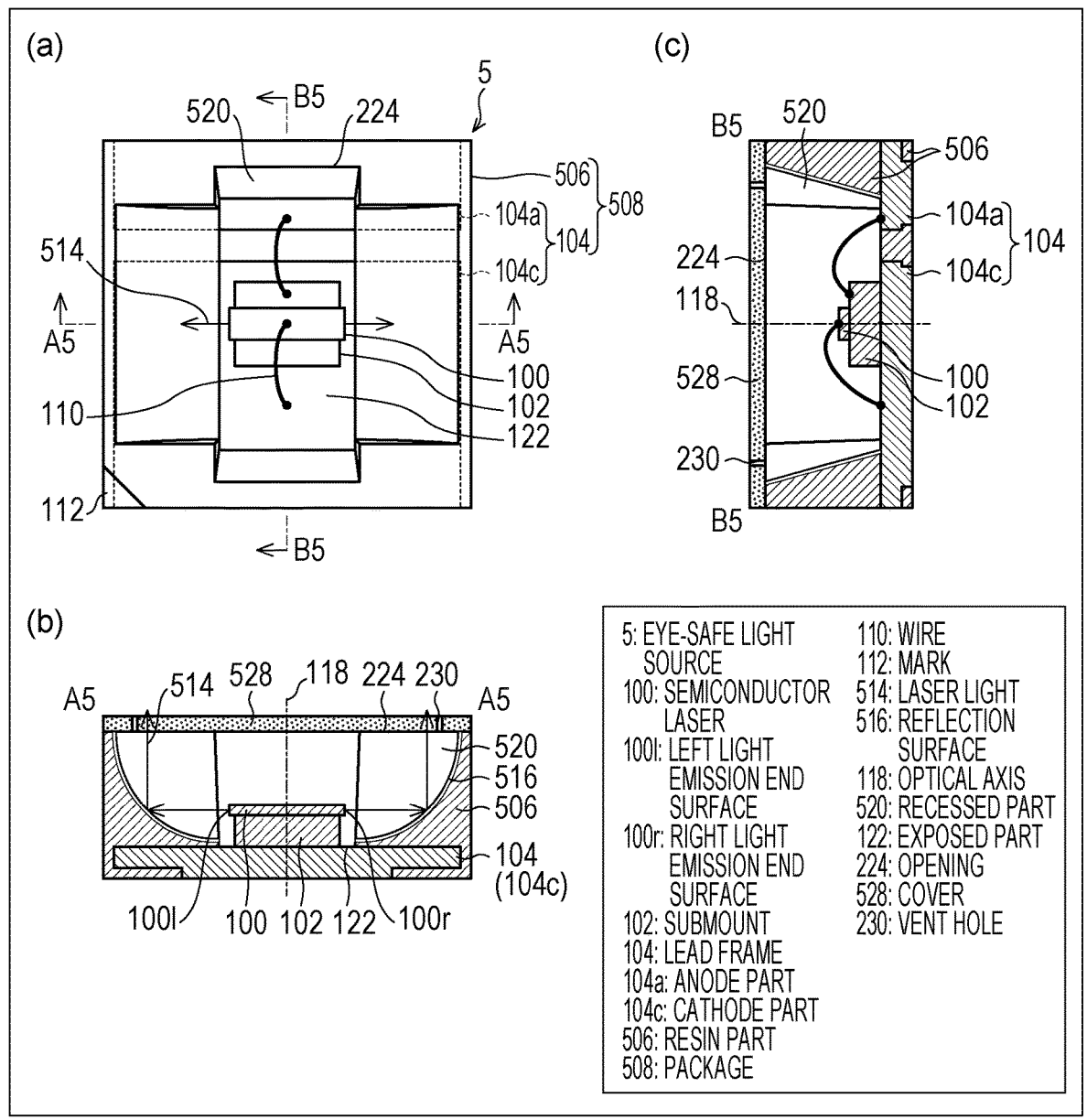
FIG. 9 is a diagram illustrating a schematic configuration around a semiconductor laser of an eye-safe light source according to a fifth embodiment of the invention. Part (a) of FIG. 9 is a top view without a cover with a resin part seen through. Part (b) of FIG. 9 is an A5-A5 sectional view of Part (a) of FIG. 9. Part (c) of FIG. 9 is a B5-B5 sectional view of Part (a) of FIG. 9.

FIG. 9 is a diagram illustrating a schematic configuration around the semiconductor laser 100 of an eye-safe light source 5 according to a fifth embodiment of the invention. Part (a) of FIG. 9 is a top view without a cover 528 with a resin part 506 seen through. Part (b) of FIG. 9 is an A5-A5 sectional view of Part (a) of FIG. 9. Part (c) of FIG. 9 is a B5-B5 sectional view of Part (a) of FIG. 9.

As illustrated in FIG. 9, the eye-safe light source 5 includes the semiconductor laser 100, the submount 102, a package 508, the wires 110, and a cover 528 (light scattering layer). The semiconductor laser 100 emits laser light 514. The semiconductor laser 100 is mounted on the submount 102. The package 508 has the lead frame 104 and the resin part 506. The cover 528 has the vent holes 230. The mark 112 is disposed to indicate the directions of the anode and the cathode.

The surface of the resin part 506 is plated with metal in each reflection surface 516 of a recessed part 520 of the resin part 506. The metal plating causes each reflection surface 516 to reflect the laser light 514 without diffusion. The surface of the resin part 506 other than the reflection surfaces 516 may be plated with metal or may not be plated with metal.

There are two differences between the eye-safe light source 2 according to the second embodiment and the eye-safe light source 5 according to the fifth embodiment.

One difference is that while each reflection surface 216 is the surface of the resin part 206 in the eye-safe light source 2 according to the second embodiment, each reflection surface 516 is coated by metal plating in the eye-safe light source 5 according to the fifth embodiment. That is, unlike the second embodiment, each reflection surface 516 according to the fifth embodiment reflects the laser light 514 without diffusion.

Another difference is that while the cover 228 is formed with a resin not including a light scattering body in the eye-safe light source 2 according to the second embodiment, the cover 528 is formed with a resin including a light scattering body in the eye-safe light source 5 according to the fifth embodiment. That is, unlike the second embodiment, the cover 528 scatters the transmitted laser light 514.

(Reflection Surface)

Hereinafter, the reflection surfaces 516 that are covered by metal plating will be described.

Since each reflection surface 516 is coated by metal plating, the laser light 514 that is parallel to the upper surface of the lead frame 104 is reflected by each reflection surface 516 in a direction parallel to the optical axis 118 without diffusion. In addition, while air is present inside the hollow recessed part 520, the light scattering body that scatters the laser light 514 is not present inside the recessed part 520. Accordingly, the laser light 514 proceeds without being scattered until reaching the cover 528 from both light emission end surfaces (the left light emission end surface 1001 and the right light emission end surface 100r). Since the laser light 514 is not scattered, the laser light 514 that is incident on the cover 528 almost maintains its light distribution characteristics and polarization characteristics at the time of emission from the semiconductor laser 100.

The reflection surfaces 516 are separated from both light emission end surfaces (the left light emission end surface 1001 and the right light emission end surface 100r) of the semiconductor laser 100, and the laser light 514 is emitted to spread from both light emission end surfaces (the left light emission end surface 1001 and the right light emission end surface 100r) of the semiconductor laser 100. Thus, on each reflection surface 516, the spot diameter of the laser light 514 is increased, and the light density of the laser light 514 is decreased. Accordingly, the laser light 514 that is reflected on each reflection surface 516 is made eye-safe to a certain extent while the laser light 514 is not diffused.

In a case where the semiconductor laser 100 is an infrared semiconductor laser, the metal used in each reflection surface 516 is desirably gold or an alloy including gold as a component. For example, the reason is that gold has high reflectance in an infrared range or a wavelength range beyond 700 nm, and is a very stable substance that does not corrode or oxidize in a general environment. Meanwhile, silver and the like initially have high light reflectance but are easily affected by corrosion and oxidation. Particularly, silver and the like are known to turn black with respect to sulfur due to sulfuration and need a special surface coat. Thus, the metal used on the surface of each reflection surface 516 is desirably gold or an alloy including gold as a component.

While the resin part 506 can be directly coated by electroless plating, a reflection structure that is formed from a metal plate by die-stamping using a die and has its surface covered by electroless plating may be prepared, and the resin part 506 may be covered with the reflection structure to form each reflection surface 516. Electroless plating of a metal structure has fewer problems such as peeling of the reflection surface and secures long-term reliability more easily than electroless plating of the resin part 506. Each reflection surface 516 formed from a metal plate may be shaped at the same time as the shaping of the resin part 506, or may be attached after the formation of the resin part 506. A reflection structure that is formed from aluminum or an aluminum alloy and has its surface anodized may also be used as each reflection surface 516 instead of a metal surface covered with gold. Since the reflectance and corrosion resistance of a plate of which the surface is made specular and then anodized is equivalent to those of gold, such a plate is suitable for securing long-term reliability.

(Cover)

Hereinafter, the cover 528 that is formed with a resin including a light scattering body will be described.

Since the cover 528 is formed with a resin including a light scattering body, the cover 528 scatters the transmitted laser light 514. Since the scattering increases the spot diameter of the laser light 514 and decreases the light density of the laser light 514, the laser light 514 that is transmitted through the cover 528 is sufficiently made eye-safe.

While the scattering disturbs the light distribution characteristics and polarization characteristics of the laser light 514, the laser light 514 that is transmitted through the cover 528 maintains its light distribution characteristics and polarization characteristics to a certain extent. The reason is that since the laser light 514 is already made eye-safe to a certain extent when the laser light 514 is incident on the cover 528, scattering that does not cause the laser light 514 to lose its light distribution characteristics and polarization characteristics can sufficiently make the laser light 514 eye-safe.

For example, by adjusting the thickness of the cover 528 and the concentration of the light scattering body included in the resin forming the cover 528, it is possible to sufficiently make the laser light 514 eye-safe and sufficiently maintain the light distribution characteristics and polarization characteristics of the laser light 514 at the same time.

(Supplementary Description Related to Submount)

The first to fifth embodiments disclose a case where the semiconductor lasers 100 and 400 are mounted on the lead frame 104 with the submount 102 in between. The reason is that in the case of directly using a tall semiconductor laser chip without a submount, thermal radiation properties deteriorate, and stress caused by expansion and contraction of the metal lead frame 104 is directly transmitted to an active layer of the semiconductor laser chip and generates a decrease in light output, a sudden shutdown, and the like of the semiconductor laser chip. By using the submount 102, such a decrease in light output and a sudden shutdown can be prevented. As in the invention, in a structure where a light emission point (light emission end surface) is set to be away from a lead frame, and laser light is efficiently emitted to a facing reflection surface, a submount has to be used.

Particularly, unlike a sapphire semiconductor laser and a gallium nitride (GaN) based semiconductor laser that uses a gallium nitride based substrate having high thermal conductivity, an infrared semiconductor laser that uses a gallium arsenide (GaAs) based substrate has low thermal conductivity, and care should be taken with respect to heat radiation. Thus, only a low-powered infrared semiconductor laser, a GaN-based semiconductor laser having high thermal radiation properties, and the like may be directly mounted on the lead frame.

Instead of the submount, a part of the lead frame 104 that corresponds to a part where the semiconductor laser is mounted may be formed to protrude. In order to form such a shape, it is considered that presswork or etching is used when the lead frame is formed. In this case, it is desirable to use metal having a small coefficient of expansion such as iron or an alloy including iron as a main ingredient so that expansion and contraction of the metal frame does not adversely affect the reliability of the semiconductor laser. Furthermore, it is important to join the semiconductor laser chip to the lead frame 104 using a material that reduces the effect of expansion and contraction like indium solder. Even in the case of working a part of the lead frame to protrude, it is important that the shape of the part does not block the optical path of the laser light. Generally, forming such a shape on the lead frame needs effort and may not be accurately performed. From this reason as well, it is desirable to use the submount 102.

Sixth Embodiment

Another embodiment of the invention will be described as follows based on FIG. 10. For convenience of description, members having the same function as the members described in the above embodiment will be designated by the same reference signs, and descriptions of such members will not be repeated.

Figure 10:
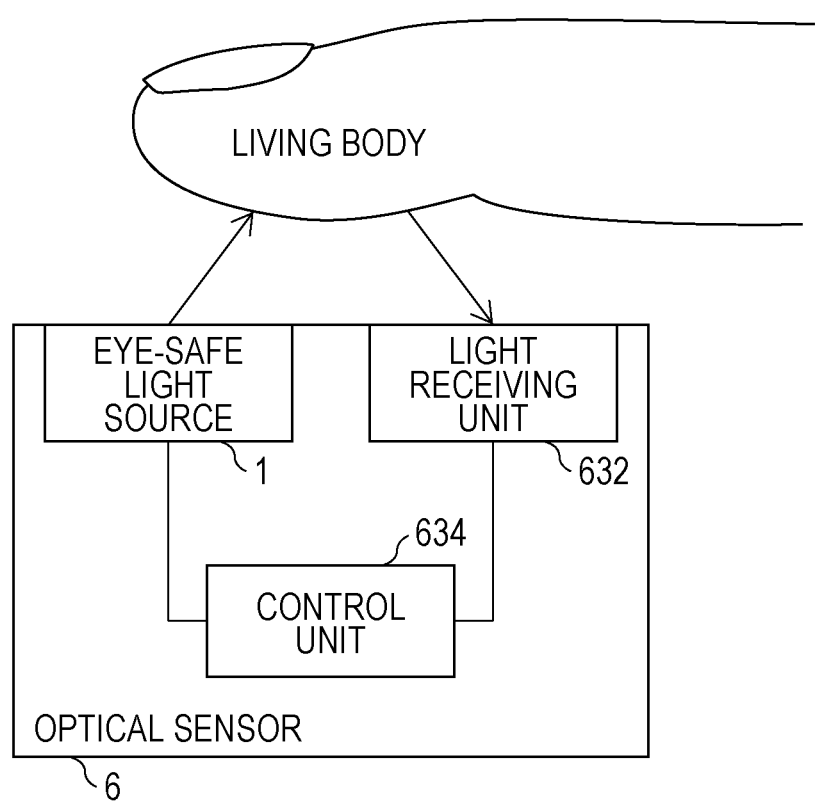
FIG. 10 is a diagram illustrating a schematic configuration of an optical sensor according to a sixth embodiment of the invention.

FIG. 10 is a diagram illustrating a schematic configuration of an optical sensor 6 according to a sixth embodiment of the invention.

As illustrated in FIG. 10, the optical sensor (electronic device) 6 includes the eye-safe light source 1 according to the first embodiment, a light receiving unit 632, and a control unit 634. The light receiving unit 632 receives reflective light from a living body. The control unit 634 controls the eye-safe light source 1 and the light receiving unit 632.

The light receiving unit 632 may be disposed in the package 108 in the same manner as the eye-safe light source 1. The light receiving unit 632 may also be disposed separately from the eye-safe light source 1.

The control unit 634 may be a semiconductor element that is disposed inside the package 108, that is, may be a semiconductor element that is joined to the lead frame 104 and resin-sealed by the resin part 106. The control unit 634 may also be disposed separately from the eye-safe light source 1.

The living body reflects eye-safe light radiated from the eye-safe light source 1, and the light receiving unit 632 receives the reflective light reflected by the living body. The control unit 634 calculates information on the living body that reflects the eye-safe light, by comparing the eye-safe light radiated from the eye-safe light source 1 with the reflective light received in the light receiving unit 632.

Since the eye-safe light source 1 is a surface-mount light source that is suitable for thinning, the optical sensor 6 is thin. Biometric information that can be collected using the eye-safe light source 1 as a light source has multiple types such as an iris, a vein in a finger, a palm, and the like, a fingerprint, and a palm print. The eye-safe light source 1 is effectively used for implementing biometric authentication using these types of biometric information in a portable electronic device. In addition to the portable electronic device, the eye-safe light source 1 can be used as a light source of a general fixed electronic device such as an automated teller machine (ATM), an electronic lock safe, and an electronic key for a vehicle or a house.

Since thinning is widely required in electronic devices, the application of the eye-safe light source 1 is not limited to biometric authentication. The eye-safe light source 1 may be used, for example, in a light projecting device, a projector, a light source for an infrared camera, a light source for a motion sensor, a small electronic device, and a portable electronic device. Even in a communication device, for example, an electronic device that needs to be optically coupled to an optic fiber, the small surface-mount eye-safe light source can be effectively used.

CONCLUSION

An eye-safe light source (1 to 5) according to a first aspect of the invention includes a substrate (packages 108, 208, 308, 408, and 508), a semiconductor laser (100, 400) that emits laser light (114, 214, 314, 414, 514) from a light emission end surface (the left light emission end surface 1001 and the right light emission end surface 100r; right light emission end surface 400r), and a wire (110) that is joined to the semiconductor laser. The semiconductor laser is joined to the substrate such that the laser light is emitted in a direction (a left-right direction in Part (a) of FIGS. 1, 3, 4, and 6 to 9) parallel to a reference surface (the upper surface of the lead frame 104) of the substrate. The substrate includes a reflection surface (116, 216, 316, 416, 516) that faces the light emission end surface and reflects the laser light. A direction (an up-down direction in Part (a) of FIGS. 1, 3, 4, and 6 to 9) in which the wire extends when seen from a direction (a depth direction in Part (a) of FIGS. 1, 3, 4, and 6 to 9) perpendicular to the reference surface is perpendicular to a direction of emission of the laser light from the light emission end surface.

According to the above configuration, the laser light is emitted in the direction parallel to the reference surface and is reflected by the reflection surface. Thus, the optical path length from the light emission end surface to the reflection surface can be increased without increasing the thickness of the eye-safe light source. By increasing the optical path length from the light emission end surface to the reflection surface, the spot diameter of the laser light on the reflection surface can be increased. By increasing the spot diameter, the light density of the laser light can be decreased, and the laser light can be made eye-safe.

According to the above configuration, the direction in which the wire extends is perpendicular to the direction of emission of the laser light when seen from the direction perpendicular to the reference surface. Thus, the wire does not block the optical path of the laser light, and the wire does not cast a shadow on a virtual light source in which the laser light is made eye-safe. Accordingly, the light emission efficiency of the eye-safe light source can be improved. In addition, since the wire does not cast a shadow, the light density and light distribution characteristics of the virtual light source are easily approximated to ideal values.

According to the above configuration, the laser light can be made eye-safe without transmitting the laser light through a light scattering region that includes a light scattering body, or by transmitting the laser light through the light scattering region such that the polarization characteristics of the laser light can be maintained. Accordingly, light that is radiated from the eye-safe light source maintains (at least partially) the polarization characteristics of the laser light. Thus, the eye-safe light source is suitable for its application that uses the polarization characteristics. For example, the eye-safe light source is suitable for an optical sensor for biometric authentication.

According to the above configuration, the laser light can be made eye-safe without transmitting the laser light through a light scattering layer that includes a light scattering body, or by transmitting the laser light through the light scattering layer such that the polarization characteristics of the laser light can be maintained. Accordingly, the light distribution characteristics of the laser light can be regulated by the reflection surface, and light emitted from the eye-safe light source maintains (at least partially) its light distribution characteristics regulated by the reflection surface. Thus, the light emission efficiency of the eye-safe light source can be improved, and the light distribution characteristics of light radiated from the eye-safe light source can also be regulated.

An eye-safe light source (1 to 3, 5) according to a second aspect of the invention is the eye-safe light source according to the first aspect in which it is preferable that light emission end surfaces (the left light emission end surface 1001 and the right light emission end surface 100r) are disposed on both sides (both of left and right sides in Part (b) of FIGS. 1, 3, 4, 6, and 9) of the semiconductor laser (100), and that reflection surfaces (116, 216, 316, 516) are disposed on both sides of the semiconductor laser to face the light emission end surfaces.

According to the above configuration, the intensity of the laser light emitted from each light emission end surface is lower than the intensity of the laser light emitted from the whole semiconductor laser. Thus, the light density of each laser light is low, and the laser light is easily made eye-safe.

An eye-safe light source (1 to 3, 5) according to a third aspect of the invention is the eye-safe light source according to the second aspect in which it is preferable that the light emission end surfaces (the left light emission end surface 1001 and the right light emission end surface 100r) are optically symmetric to each other, that the reflection surfaces (116, 216, 316, 516) have plane symmetry about a first plane of symmetry (the B1-B1 sectional view in FIG. 1, the B2-B2 sectional view in FIG. 4, the B3-B3 sectional view in FIG. 6, and the B5-B5 sectional view in FIG. 9), and that the first plane of symmetry is a plane that passes through a center of the semiconductor laser and is perpendicular to the direction of emission of the laser light from the light emission end surface.

According to the above configuration, since the light emission end surface on both sides of the semiconductor laser is optically symmetric, the laser light can be symmetrically emitted to both sides. Furthermore, since the reflection surface that reflects the symmetric laser light is also symmetric, the reflected laser light is also symmetric. Accordingly, the symmetry of the eye-safe light source can be improved.

An eye-safe light source (4) according to a fourth aspect of the invention is the eye-safe light source according to the first aspect in which it is preferable that the light emission end surface (right light emission end surface 400r) is disposed on one side (the right side in Part (b) of FIG. 7) of the semiconductor laser (400), and that the reflection surface (416) is disposed on the one side of the semiconductor laser to face the light emission end surface.

An eye-safe light source (1 to 5) according to a fifth aspect of the invention is the eye-safe light source according to any one of the first to fourth aspects in which it is preferable that the reflection surface (116, 216, 316, 416, 516) has plane symmetry about a second plane of symmetry (the A1-A1 sectional view in FIG. 1, the A2-A2 sectional view in FIG. 4, the A3-A3 sectional view in FIG. 6, the A4-A4 sectional view in FIG. 7, and the A5-A5 sectional view in FIG. 9), and that the second plane of symmetry is a plane that passes through a light emission center of the light emission end surface and is perpendicular to the reference surface (the upper surface of the lead frame 104) and parallel to the direction of emission of the laser light (114, 214, 314, 414, 514) from the light emission end surface (the left light emission end surface 1001 and the right light emission end surface 100r; right light emission end surface 400r).

According to the above configuration, the reflection surface that reflects the laser light is symmetric when seen from the laser light. Thus, the symmetry of the eye-safe light source can be improved.

An eye-safe light source (1 to 5) according to a sixth aspect of the invention is the eye-safe light source according to any one of the first to fifth aspects in which it is preferable that the substrate (114, 214, 314, 414, 514) includes a metal lead frame (lead frame 104) and a resin (resin parts 106, 206, 306, 406, and 506) that at least partially covers the metal lead frame, and that the semiconductor laser (100, 400) is joined to the metal lead frame.

According to the above configuration, the substrate includes the metal lead frame. Since the metal lead frame has excellent mechanical strength, the substrate is reinforced by the metal lead frame. Accordingly, the substrate can be thinned while necessary strength is maintained.

According to the above configuration, the semiconductor laser is joined to the metal lead frame. Since the metal lead frame has excellent thermal conductivity and thermal radiation properties, heat that is generated by light emission of the semiconductor laser is easily radiated. Accordingly, the light emitting device has excellent thermal radiation properties.

For the heat radiation, it is preferable that the metal lead frame is exposed as far as possible from the resin that packages the metal lead frame. For example, the reflection surface and the semiconductor laser may be disposed on one side of the metal lead frame, and the other side of the metal lead frame may be exposed to the outside.

An eye-safe light source (1 to 5) according to a seventh aspect of the invention is the eye-safe light source according to any one of the first to sixth aspects in which it is preferable that the semiconductor laser (100, 400) is joined to the substrate with the submount in between.

According to the above configuration, the semiconductor laser is joined to the substrate with the submount in between. Thus, even when the output of the semiconductor laser is high-powered, heat is efficiently radiated by the submount, and stress caused by a difference in coefficient of thermal expansion is reduced. In addition, by adjusting the height (the distance from the substrate to the semiconductor laser) of the submount, the position of the light emission end surface with respect to the reflection surface can be adjusted.

Furthermore, it is preferable that the semiconductor laser (100, 400) is joined to the substrate with the submount in between such that the light emission end surface (the left light emission end surface 1001 and the right light emission end surface 100r; right light emission end surface 400r) extends over the submount (102) when seen from the direction perpendicular to the reference surface (the upper surface of the lead frame 104).

According to the above configuration, the light emission end surface of the semiconductor substrate extends over the submount. Thus, the submount does not block the optical path of the laser light that is emitted to spread from the light emission end surface. Since the submount does not block the optical path of the laser light, the submount does not cast a shadow on the virtual light source in which the laser light is made eye-safe. Accordingly, the light emission efficiency of the eye-safe light source can be improved. In addition, since the submount does not cast a shadow, the light density and light distribution characteristics of the virtual light source are ideally set easily.

An eye-safe light source (1 to 5) according to an eighth aspect of the invention is the eye-safe light source according to any one of the first to seventh aspects in which it is preferable that a light scattering body that scatters the laser light (114, 214, 314, 414, 514) is not present between the light emission end surface (the left light emission end surface 1001 and the right light emission end surface 100r; right light emission end surface 400r) and the reflection surface (116, 216, 316, 416, 516) facing the light emission end surface.

According to the above configuration, the light scattering body is not present between the light emission end surface and the reflection surface. Thus, the laser light is not scattered while the laser light is emitted from the semiconductor laser and reflected by the reflection surface. Accordingly, the reflection surface reflects the laser light that maintains its light distribution characteristics at the time of emission. Thus, the light distribution characteristics of the laser light can be regulated by the reflection surface. Accordingly, for example, the laser light can be regulated to collimated light. In addition, for example, the laser light can be regulated to a ray of light having a light intensity distribution in which the light intensity is approximately constant in a predetermined range and almost zero outside the predetermined range, so that the laser light is suitable for optical wireless communication, optical sensing, and the like. In addition, since the light distribution characteristics can be regulated by the reflection surface, a lens for regulating the light distribution characteristics of the laser light that is made eye-safe does not need to be disposed on the optical path.

In addition, the laser light is not subjected to multiple scattering between the light emission end surface and the reflection surface. Thus, light absorption caused by multiple scattering does not occur between the light emission end surface and the reflection surface. Accordingly, light extraction efficiency (light emission efficiency) with respect to the electric power consumption of the eye-safe light source can be improved.

In addition, since the light scattering body that scatters the laser light is not present in the vicinity of the light emission end surface, light absorption caused by the light scattering body does not occur. Thus, heat generation that is caused by light absorption due to the light scattering body does not occur in the vicinity of the light emission end surface, and thermal damage to substances in the vicinity of the light emission end surface due to the heat generation does not occur. Accordingly, it is possible to prevent a decrease in the function of the eye-safe light source caused by modification of the substances in the vicinity of the light emission end surface. That is, deterioration of the eye safety properties and light emission efficiency of the eye-safe light source caused by continuous use, long-term use, and the like can be prevented.

An eye-safe light source (1 to 4) according to a ninth aspect of the invention is the eye-safe light source according to any one of the first to eighth aspects in which it is preferable that the reflection surface (116, 216, 316, 416) is formed with a resin (resin parts 106, 206, 306, and 406) including a light scattering body that scatters the laser light (114, 214, 314, 414).

According to the above configuration, the reflection surface is the surface of the resin including the light scattering body. Thus, since the laser light is diffusely reflected on the reflection surface, the laser light is further made eye-safe.

According to the above configuration, the reflection surface is the surface of the resin. Thus, surface working such as metal plating is not needed. Accordingly, the number of manufacturing steps for the eye-safe light source can be decreased, and the cost of manufacturing can be reduced.

Particularly, in the case of the eye-safe light source according to the sixth aspect, the reflection surface can be formed at the same time as the formation of the substrate using a resin including a light scattering body that scatters the laser light as the resin covering the metal lead frame. Accordingly, the number of manufacturing steps and the number of ingredients of the eye-safe light source can be decreased, and the cost of manufacturing the eye-safe light source can be reduced.

An eye-safe light source (5) according to a tenth aspect of the invention is the eye-safe light source according to any one of the first to eighth aspects in which it is preferable that the reflection surface is formed with metal.

According to the above configuration, the reflection surface is a surface of metal and may be, for example, the surface of a resin plated with metal. Thus, since the reflection surface reflects the laser light without diffusion, the reflection surface can efficiently regulate the light distribution characteristics of the laser light.

An eye-safe light source (5) according to an eleventh aspect of the invention is the eye-safe light source according to any one of the first to tenth aspects in which it is preferable that the laser light (514) that is reflected by the reflection surface (516) is transmitted through a light scattering layer (cover 528) including a light scattering body that scatters the laser light.

According to the above configuration, the laser light is transmitted through the light scattering layer including the light scattering body while the laser light is scattered. Thus, the laser light is further made eye-safe.

An eye-safe light source (2, 3, 5) according to a twelfth aspect of the invention is the eye-safe light source according to any one of the first to eleventh aspects in which it is preferable that the reflection surface (216, 316, 516) includes a part of a curved surface (a surface acquired by translating a parabola; a paraboloid of revolution and the like) composed of a parabola.

According to the above configuration, the reflection surface includes a part of the curved surface composed of the parabola. Thus, the light distribution characteristics of the laser light that is emitted to spread from the light emission end surface can be regulated, and the spread angle of the laser light can be controlled. For example, the laser light can be collimated.

An eye-safe light source (2, 3, 5) according to a thirteenth aspect of the invention is the eye-safe light source according to the twelfth aspect in which it is preferable that the curved surface is a surface of a solid of revolution that is drawn by a trajectory of rotation of the parabola when the parabola is rotated about an axis of symmetry of the parabola as an axis of rotation, or an axis inclined with respect to the axis of symmetry of the parabola as an axis of rotation.

According to the above configuration, the axis of symmetry or any axis that is inclined with respect to the axis of symmetry can be appropriately chosen as the axis of rotation. Accordingly, it is possible to regulate the light distribution characteristics of the laser light or control the spread angle of the laser light. For example, by choosing the axis of rotation, it is possible to increase, decrease, or make the spot diameter of the laser light constant.

An eye-safe light source (2, 3, 5) according to a fourteenth aspect of the invention is the eye-safe light source according to the twelfth or thirteenth aspect in which it is preferable that a position of a focus of the parabola matches a position of the light emission end surface (the left light emission end surface 100*l* and the right light emission end surface 100*r*) in the direction perpendicular to the reference surface (the upper surface of the lead frame 104).

According to the above configuration, the light emission end surface of the semiconductor laser matches the position of the focus of the reflection surface in the direction perpendicular to the reference surface. Thus, in a case where the axis of symmetry matches the axis of rotation, the reflected laser light can be collimated, and the half angle of the light distribution characteristics of the reflected laser light can be decreased. Accordingly, light emitted by the eye-safe light source can reach further while maintaining a narrow spot. In addition, by inclining the axis of rotation with respect to the axis of symmetry, the spot diameter of the laser light can be decreased or increased without changing the thickness of the eye-safe light source and the resonator length of the semiconductor laser.

An eye-safe light source according to a fifteenth aspect of the invention is the eye-safe light source according to the twelfth aspect in which it is preferable that a position of a focus of the parabola is different from a position of the light emission end surface in the direction perpendicular to the reference surface (the upper surface of the lead frame 104).

According to the above configuration, the light emission end surface of the semiconductor laser is separated from the position of the focus of the reflection surface in the direction perpendicular to the reference surface. Thus, the half angle of the light distribution characteristics of the reflected laser light can be increased to a predetermined angle. Accordingly, since the diameter of the virtual light source in which the laser light is made eye-safe is increased, light emitted by the eye-safe light source is further made eye-safe.

An eye-safe light source (1 to 5) according to a sixteenth aspect of the invention is the eye-safe light source according to any one of the first to fifteenth aspects in which it is preferable that the semiconductor laser (100, 400) is not resin-sealed. In other words, it is preferable that the light emission end surface (the left light emission end surface 100*l* and the right light emission end surface 100*r*; right light emission end surface 400*r*) is in contact with gas (air) or a vacuum.

According to the above configuration, the semiconductor laser is not resin-sealed. Thus, even when the semiconductor laser generates heat along with its light emission, stress caused by a difference in coefficient of thermal expansion between the semiconductor laser and a sealing resin is not generated. Accordingly, it is possible to avoid a defect that is caused by stress applied to the semiconductor laser or other parts.

An eye-safe light source (1 to 5) according to a seventeenth aspect of the invention is the eye-safe light source according to the sixteenth aspect, further including a cover (228, 528) that covers the substrate (114, 214, 314, 414, 514), in which it is preferable that the light emission end surface (the left light emission end surface 100*l* and the right light emission end surface 100*r*; right light emission end surface 400*r*) is in contact with gas (air), and that the cover (228, 528) or the substrate (114, 214, 314, 414, 514) includes a vent hole (230) through which gas flows between an internal space and an external space. It is preferable that the cover (228, 528) covers the substrate (114, 214, 314, 414, 514) such that the semiconductor laser (100, 400) is accommodated in the internal space (recessed parts 120, 220, 320, 420, 520) between the substrate and the cover.

According to the above configuration, by including the vent hole, the gas that surrounds the semiconductor laser can flow inside and outside the eye-safe light source. That is, the semiconductor laser is not gas-sealed. Thus, even when the gas surrounding the semiconductor laser thermally expands due to heat generated by the semiconductor laser or a rapid change in temperature caused by an external factor such as a reflow soldering step, expansive pressure and compressive pressure are not generated. Accordingly, it is possible to avoid a defect that is caused by expansive pressure and compressive pressure applied to the semiconductor laser or other parts.

An eye-safe light source (1 to 5) according to an eighteenth aspect of the invention is the eye-safe light source according to the sixteenth aspect in which it is preferable that the semiconductor laser is gas-sealed by inert gas.

According to the above configuration, the semiconductor laser is gas-sealed by inert gas. Thus, since the semiconductor laser is protected from active gas, deterioration such as a breakage in the light emission end surface does not easily occur. Accordingly, it is possible to use a semiconductor laser such as a blue semiconductor laser that needs to be gas-sealed by inert gas.

According to the above configuration, the semiconductor laser is gas-sealed. Thus, since the semiconductor laser is protected from an external environment, the eye-safe light source 1 can be used under an adverse condition such as an environment where condensation occurs, and an environment where there is a large amount of grime. In addition, the eye-safe light source 1 can be used for an application that requires high reliability, such as an application in which the eye-safe light source 1 is mounted in a vehicle.

An eye-safe light source (1 to 5) according to a nineteenth aspect of the invention is the eye-safe light source according to any one of the first to eighteenth aspects in which it is preferable that the laser light (114, 214, 314, 414, 514) has a wavelength longer than 700 nm.

According to the above configuration, the wavelength of the laser light is in an infrared range beyond 700 nm. As the wavelength is increased, the penetration depth is increased. Thus, an eye-safe light source suitable for biometric authentication can be implemented. Particularly, in the case of detecting a vein in a palm, a finger, and the like, absorption of the laser light in the vein is clearly seen in a wavelength range beyond 700 nm or the infrared range. Thus, when the light in such a range is observed while the light is radiated, an image having a clear contrast between the vein and the other part is acquired.

An eye-safe light source (1 to 5) according to a twentieth aspect of the invention is the eye-safe light source according to any one of the first to nineteenth aspects in which it is preferable that the eye-safe light source is a surface-mount type.

According to the above configuration, since the light distribution characteristics of the laser light are regulated by the reflection surface, the eye-safe light source does not need a lens for regulating the light distribution characteristics. Thus, the eye-safe light source can be thinned, and the eye-safe light source is suitable for a surface-mount type.

An eye-safe light source (1 to 5) according to a twenty-first aspect of the invention is the eye-safe light source according to any one of the first to twentieth aspects, further including an optical opening part (124, 224, 324, 424; or the covers 228 and 528 covering the opening 224) that is parallel to the reference surface (the upper surface of the lead frame 104), in which it is preferable that the laser light (114, 214, 314, 414, 514) is radiated through the opening part.

An electronic device (optical sensor 6) according to a twenty-second aspect of the invention is characterized by including the eye-safe light source according to any one of the first to twenty-first aspects.

According to the above configuration, an electronic device that includes the eye-safe light source according to the invention can be implemented.

An electronic device (optical sensor 6) according to a twenty-third aspect of the invention is the electronic device according to the twenty-second aspect in which it is preferable that the electronic device is for biometric authentication.

According to the above configuration, an electronic device for biometric authentication that includes the eye-safe light source according to the invention can be implemented.

An electronic device (optical sensor 6) according to a twenty-fourth aspect of the invention is the electronic device according to the twenty-second aspect in which it is preferable that the electronic device is a small light projecting device.

According to the above configuration, a small light projecting device that includes the eye-safe light source according to the invention can be implemented.

An electronic device (optical sensor 6) according to a twenty-fifth aspect of the invention is the electronic device according to the twenty-second aspect in which it is preferable that the electronic device is a small projector.

According to the above configuration, a small projector that includes the eye-safe light source according to the invention can be implemented.

An electronic device (optical sensor 6) according to a twenty-sixth aspect of the invention is the electronic device according to the twenty-second aspect in which it is preferable that the electronic device is coupled to an optic fiber.

The invention is not limited to each embodiment described above, and various changes can be made within the scope disclosed in the claims. Embodiments that are acquired by appropriately combining technical means disclosed in different embodiments also fall within the technical scope of the invention. Furthermore, new technical features can be formed by combining technical means disclosed in each embodiment.

For example, while each of the first to third and fifth embodiments basically discloses a structure that is axially symmetric, this does not exclude the use of the structure by intentionally changing the axial symmetry to asymmetry depending on the purpose of use. In addition, the optical axis after the laser light is reflected on the reflection surface may not be in the direction perpendicular to the lead frame. By setting a different inclination angle for the reflection surface on the left and right sides, or by inclining the axis of symmetry of the paraboloid with respect to a line perpendicular to the lead frame, the optical axis can be inclined to a desired direction, and this also falls within the technical scope of the invention.

INDUSTRIAL APPLICABILITY

The invention can be used for, for example, a small light projecting device, a light source for an infrared camera, a light source for a motion sensor, a small projector, and an electronic device for biometric authentication, particularly, an electronic device for biometric authentication that uses polarization characteristics. Furthermore, the invention can be used for a light source of a communication device, for example, an electronic device that needs to be optically coupled to an optic fiber. In addition, the invention is suitable for surface mount.

REFERENCE SIGNS LIST 1, 2, 3, 4, 5 EYE-SAFE LIGHT SOURCE
6 OPTICAL SENSOR (ELECTRONIC DEVICE)
100, 400 SEMICONDUCTOR LASER
100l LEFT LIGHT EMISSION END SURFACE (LIGHT EMISSION END SURFACE)
100r, 400r RIGHT LIGHT EMISSION END SURFACE (LIGHT EMISSION END SURFACE)
102 SUBMOUNT
104 LEAD FRAME (METAL LEAD FRAME)
104a ANODE PART
104c CATHODE PART
106, 206, 306, 406, 506 RESIN PART (RESIN)
108, 208, 308, 408, 508 PACKAGE (SUBSTRATE)
110 WIRE
114, 214, 224, 314, 414, 514 LASER LIGHT
116, 216, 316, 416, 516 REFLECTION SURFACE
118 OPTICAL AXIS
120, 220, 320, 420, 520 RECESSED PART
122 EXPOSED PART
124, 224, 324, 424 OPENING
128a, 128b, 228, 228a, 428b, 528 COVER (LIGHT SCATTERING LAYER)
132, 432 LENS
134, 234 OPTICAL AXIS
230 VENT HOLE
632 LIGHT RECEIVING UNIT
634 CONTROL UNIT

The invention claimed is:

1. An eye-safe light source comprising:
a substrate;
a semiconductor laser that emits laser light from a light emission end surface; and
a wire that is joined to the semiconductor laser,
wherein the semiconductor laser is joined to the substrate such that the laser light is emitted in a direction parallel to a reference surface of the substrate,
the substrate has a resin part,
the resin part includes a reflection surface that faces the light emission end surface and reflects the laser light,
a direction in which the wire extends when seen from a direction perpendicular to the reference surface is perpendicular to a direction of emission of the laser light from the light emission end surface,
the reflection surface is covered with metal,
the substrate includes a metal lead frame and a resin that at least partially covers the metal lead frame, and
the semiconductor laser is joined to the metal lead frame.

2. The eye-safe light source according to claim 1, wherein light emission end surfaces are disposed on both sides of the semiconductor laser, and
reflection surfaces are disposed on both sides of the semiconductor laser to face the light emission end surfaces.

3. The eye-safe light source according to claim 2, wherein the light emission end surfaces are optically symmetric to each other,
the reflection surfaces have plane symmetry about a plane of symmetry, and
the plane of symmetry is a plane that passes through a center of the semiconductor laser and is perpendicular to the direction of emission of the laser light from the light emission end surfaces.

4. The eye-safe light source according to claim 1, wherein the light emission end surface is disposed on one side of the semiconductor laser, and
the reflection surface is disposed on the one side of the semiconductor laser to face the light emission end surface.

5. The eye-safe light source according to claim 4, wherein the reflection surface has plane symmetry about a plane of symmetry, and
the plane of symmetry is a plane that passes through a light emission center of the light emission end surface and is perpendicular to the reference surface and parallel to the direction of emission of the laser light from the light emission end surface.

6. The eye-safe light source according to claim 1, wherein a light scattering body that scatters the laser light is not present between the light emission end surface and the reflection surface facing the light emission end surface.

7. The eye-safe light source according to claim 1, wherein the laser light that is reflected by the reflection surface is transmitted through a light scattering layer including a light scattering body that scatters the laser light.

8. The eye-safe light source according to claim 1, wherein the reflection surface includes a part of a curved surface composed of a parabola.

9. The eye-safe light source according to claim 8, wherein the curved surface is a surface of a solid of revolution that is drawn by a trajectory of rotation of the parabola when the parabola is rotated about an axis of symmetry of the parabola as an axis of rotation, or an axis inclined with respect to the axis of symmetry of the parabola as an axis of rotation.

10. The eye-safe light source according to claim 8, wherein
a position of a focus of the parabola matches a position of the light emission end surface in the direction perpendicular to the reference surface.

11. An eye-safe light source comprising:
a substrate;
a semiconductor laser that emits laser light from a light emission end surface; and
a wire that is joined to the semiconductor laser,
wherein the semiconductor laser is joined to the substrate such that the laser light is emitted in a direction parallel to a reference surface of the substrate,
the substrate has a resin part,
the resin part includes a reflection surface that faces the light emission end surface and reflects the laser light,
a direction in which the wire extends when seen from a direction perpendicular to the reference surface is perpendicular to a direction of emission of the laser light from the light emission end surface,
the reflection surface is covered with metal,
the semiconductor laser is joined to the substrate with a submount in between such that the light emission end surface extends over the submount when seen from the direction perpendicular to the reference surface.

12. The eye-safe light source according to claim 11, wherein
light emission end surfaces are disposed on both sides of the semiconductor laser, and
reflection surfaces are disposed on both sides of the semiconductor laser to face the light emission end surfaces.

13. The eye-safe light source according to claim 12, wherein
the light emission end surfaces are optically symmetric to each other,
the reflection surfaces have plane symmetry about a plane of symmetry, and
the plane of symmetry is a plane that passes through a center of the semiconductor laser and is perpendicular to the direction of emission of the laser light from the light emission end surfaces.

14. The eye-safe light source according to claim 11, wherein
the light emission end surface is disposed on one side of the semiconductor laser, and
the reflection surface is disposed on the one side of the semiconductor laser to face the light emission end surface.

15. The eye-safe light source according to claim 14, wherein
the reflection surface has plane symmetry about a plane of symmetry, and
the plane of symmetry is a plane that passes through a light emission center of the light emission end surface and is perpendicular to the reference surface and parallel to the direction of emission of the laser light from the light emission end surface.

16. The eye-safe light source according to claim 11, wherein
a light scattering body that scatters the laser light is not present between the light emission end surface and the reflection surface facing the light emission end surface.

17. The eye-safe light source according to claim 11, wherein
the laser light that is reflected by the reflection surface is transmitted through a light scattering layer including a light scattering body that scatters the laser light.

18. The eye-safe light source according to claim 11, wherein
the reflection surface includes a part of a curved surface composed of a parabola.

19. The eye-safe light source according to claim 18, wherein
the curved surface is a surface of a solid of revolution that is drawn by a trajectory of rotation of the parabola when the parabola is rotated about an axis of symmetry of the parabola as an axis of rotation, or an axis inclined with respect to the axis of symmetry of the parabola as an axis of rotation.

20. The eye-safe light source according to claim 18, wherein
a position of a focus of the parabola matches a position of the light emission end surface in the direction perpendicular to the reference surface.

* * * * *